United States Patent
Howard et al.

(10) Patent No.: US 11,031,689 B2
(45) Date of Patent: Jun. 8, 2021

(54) METHOD FOR RAPID TESTING OF FUNCTIONALITY OF PHASE-CHANGE MATERIAL (PCM) RADIO FREQUENCY (RF) SWITCHES

(71) Applicant: Newport Fab, LLC, Newport Beach, CA (US)

(72) Inventors: David J. Howard, Irvine, CA (US); Gregory P. Slovin, Irvine, CA (US); Nabil Ei-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/884,775

(22) Filed: May 27, 2020

(65) Prior Publication Data
US 2020/0287281 A1    Sep. 10, 2020

Related U.S. Application Data

(63) Continuation-in-part of application No. 16/543,466, filed on Aug. 16, 2019, now Pat. No. 10,862,477, which is a continuation-in-part of application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018, now Pat. No. 10,707,125, and a continuation-in-part of application No. 16/161,960, filed on Oct. 16, 2018, now Pat. No. 10,644,235, and a continuation-in-part of application No. 16/274,998, filed on Feb. 13, 2019, now Pat. No. 10,686,128, and a continuation-in-part of application No. 16/276,094, filed on Feb. 14, 2019, now Pat. No. 10,693,061.

(51) Int. Cl.
*H01Q 3/26*    (2006.01)
*G01R 31/327*  (2006.01)
*G01R 31/26*   (2020.01)

(52) U.S. Cl.
CPC ......... *H01Q 3/267* (2013.01); *G01R 31/2637* (2013.01); *G01R 31/327* (2013.01)

(58) Field of Classification Search
None
See application file for complete search history.

(56) References Cited

U.S. PATENT DOCUMENTS 7,761,067 B1    7/2010  Tsai et al.
10,505,106 B1  12/2019  Joshi
(Continued)

*Primary Examiner* — Evren Seven
(74) *Attorney, Agent, or Firm* — Farjami & Farjami LLP

(57) ABSTRACT

A rapid testing read out integrated circuit (ROIC) includes phase-change material (PCM) radio frequency (RF) switches residing on an application specific integrated circuit (ASIC). Each PCM RF switch includes a PCM and a heating element transverse to the PCM. The ASIC is configured to provide amorphizing and crystallizing electrical pulses to a selected PCM RF switch. The ASIC is also configured to determine if the selected PCM RF switch is in an OFF state or in an ON state. In one implementation, a testing method using the ASIC is disclosed.

20 Claims, 11 Drawing Sheets

(56) References Cited

U.S. PATENT DOCUMENTS

| | | | |
|---|---|---|---|
| 2004/0113232 A1* | 6/2004 | Johnson | H01L 45/126 257/529 |
| 2005/0212090 A1 | 9/2005 | Friedrich et al. | |
| 2007/0246766 A1 | 10/2007 | Liu | |
| 2008/0142777 A1 | 6/2008 | Park | |
| 2008/0272355 A1 | 11/2008 | Cho | |
| 2008/0291718 A1 | 11/2008 | Liu | |
| 2009/0065761 A1 | 3/2009 | Chen | |
| 2009/0115052 A1 | 5/2009 | Treece et al. | |
| 2010/0238603 A1 | 9/2010 | Chung | |
| 2010/0246247 A1 | 9/2010 | Kim | |
| 2011/0097825 A1 | 4/2011 | Cheng | |
| 2012/0037872 A1 | 2/2012 | Ikarashi | |
| 2014/0110657 A1 | 4/2014 | Redaelli | |
| 2015/0104921 A1 | 4/2015 | Terai et al. | |
| 2016/0056373 A1 | 2/2016 | Goktepeli | |
| 2018/0266974 A1 | 9/2018 | Khosravani | |
| 2019/0165264 A1 | 5/2019 | Wu | |

* cited by examiner

US 11,031,689 B2

METHOD FOR RAPID TESTING OF FUNCTIONALITY OF PHASE-CHANGE MATERIAL (PCM) RADIO FREQUENCY (RF) SWITCHES

CLAIMS OF PRIORITY

This is a divisional of application Ser. No. 16/543,466 filed on Aug. 16, 2019. The application Ser. No. 16/543,466 filed on Aug. 16, 2019 ("the parent application") is a continuation-in-part of and claims the benefit of and priority to application Ser. No. 16/103,490 filed on Aug. 14, 2018, titled "Manufacturing RF Switch Based on Phase-Change Material". The parent application is also a continuation-in-part of and claims the benefit of and priority to application Ser. No. 16/103,587 filed on Aug. 14, 2018, titled "Design for High Reliability RF Switch Based on Phase-Change Material". The parent application is also a continuation-in-part of and claims the benefit of and priority to application Ser. No. 16/103,646 filed on Aug. 14, 2018, titled "PCM RF Switch Fabrication with Subtractively Formed Heater". The parent application is further a continuation-in-part of and claims the benefit of and priority to application Ser. No. 16/114,106 filed on Aug. 27, 2018 titled "Fabrication of Contacts in an RF Switch Having a Phase-Change Material (PCM) and a Heating Element". The parent application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance". Furthermore, the parent application is a continuation-in-part of and claims the benefit of and priority to application Ser. No. 16/274,998 filed on Feb. 13, 2019, titled "Semiconductor Devices Having Phase-Change Material (PCM) Radio Frequency (RF) Switches and Integrated Passive Devices". In addition, the parent application is a continuation-in-part of and claims the benefit of and priority to application Ser. No. 16/276,094 filed on Feb. 14, 2019, titled "Semiconductor Devices Having Phase-Change Material (PCM) Radio Frequency (RF) Switches and Integrated Active Devices". The disclosures and contents of all of the above-identified applications are hereby incorporated fully by reference into the parent application and the present divisional application.

BACKGROUND

The lifetime reliability of a radio frequency (RF) switch (e.g., how many times the RF switch can cycle ON and OFF without error) is a figure of merit that can determine the marketability of the RF switch and its suitability for a given application. Accurately quantifying the lifetime reliability can be problematic. Errors can be infrequent and random in nature. Computer simulations cannot accurately predict the behavior of the RF switch over an entire lifetime. In order to achieve statistically significant results, it might be necessary to test a given RF switch design for more than one million cycles.

Conventional techniques of testing RF switches, for example, by connecting external probes of an automated test equipment (ATE) to one RF switch at a time, have significant time delays that render generating large sets of test data impractical. Conventional means of testing can also introduce problems associated with the impedance of cables or wirebonds, and reduce the accuracy of test data (e.g., causing the ATE to falsely record an error or non-error).

Younger technologies such as phase-change material (PCM) RF switches are particularly in need of reliability testing due to lack of historical test data. However, when resorting to conventional testing, by for example using an ATE, further time delays associated with generating the required temperatures to crystallize and amorphize the PCM in each individual RF switch can further add to the general difficulties in reliability testing of RF switches mentioned above, and additionally impede generating large sets of test data.

Thus, there is need in the art to generate large sets of reliability test data for PCM RF switches accurately and rapidly.

SUMMARY

The present disclosure is directed to a read out integrated circuit (ROIC) for rapid testing of functionality of phase-change material (PCM) radio frequency (RF) switches, substantially as shown in and/or described in connection with at least one of the figures, and as set forth in the claims.

DETAILED DESCRIPTION

Figure 1:
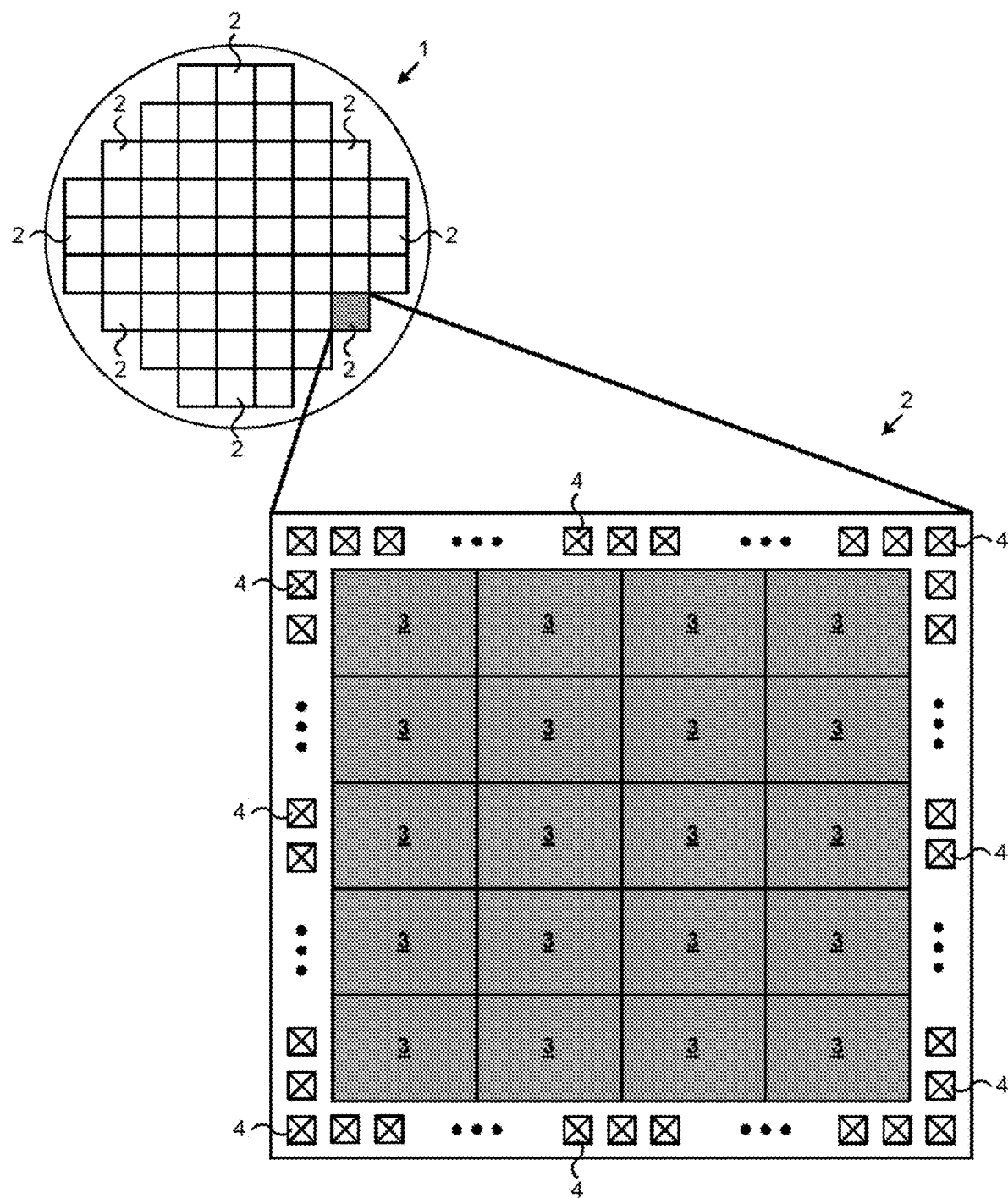
FIG. 1 illustrates a layout of a wafer and an expanded layout of a rapid testing read out integrated circuit (ROIC) according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a layout of a wafer and an expanded layout of a rapid testing read out integrated circuit (ROIC) according to one implementation of the present application. As shown in FIG. 1, wafer 1 includes multiple ROICs 2. Each of the ROICs 2 has a corresponding die on wafer 1. In one implementation, wafer 1 is a silicon wafer having a diameter of approximately two hundred millimeters (200 mm). In the present implementation, fifty seven (57) ROICs 2 are situated on wafer 1. In various implementations, wafer 1 can include greater or fewer ROICs 2. In one implementation, each of ROICs 2 has dimensions of approximately twenty millimeters by approximately twenty millimeters (20 mm×20 mm).

As shown in expanded layout in FIG. 1, each of ROICs 2 includes designs 3 and contact pads 4. As described below, each of designs 3 includes an array of phase-change material (PCM) radio frequency (RF) switches (not shown in FIG. 1) to be tested. In the present implementation, each of ROICs 2 contains twenty designs 3. In various implementations, each of ROICs 2 can include greater or fewer designs 3. Different designs 3 can include different PCM RF switches. However, in one implementation, all designs 3 contain identical PCM RF switches. In one implementation, each of designs 3 has dimensions of approximately four millimeters by approximately five millimeters (4 mm×5 mm).

Contact pads 4 provide contact points for external probes (not shown in FIG. 1). As described below, programming signals and test signals for testing PCM RF switches in designs 3 are generated in ROICs 2. Thus, contact pads 4 are generally not used for receiving programming signals and test signals from external probes. Rather, contact pads 4 are generally used to read out test data generated by ROICs 2. External probes can be coupled to an automatic test equipment (ATE; not shown in FIG. 1) for receiving and analyzing test data generated by ROICs 2. Contact pads 4 can also be used for other functions, such as providing power and/or ground to ROICs 2, and providing bi-directional communications between ROICs 2 and the ATE. In the present implementation, contact pads 4 have an approximately square shape, line the edges of each of ROICs 2, and surround designs 3. In one implementation, each of contact pads 4 has dimensions of approximately one hundred fifty microns by approximately one hundred fifty microns (150 μm×150 μm). In various implementations, contact pads 4 can have any other shapes and/or arrangements in ROICs 2.

Figure 2:
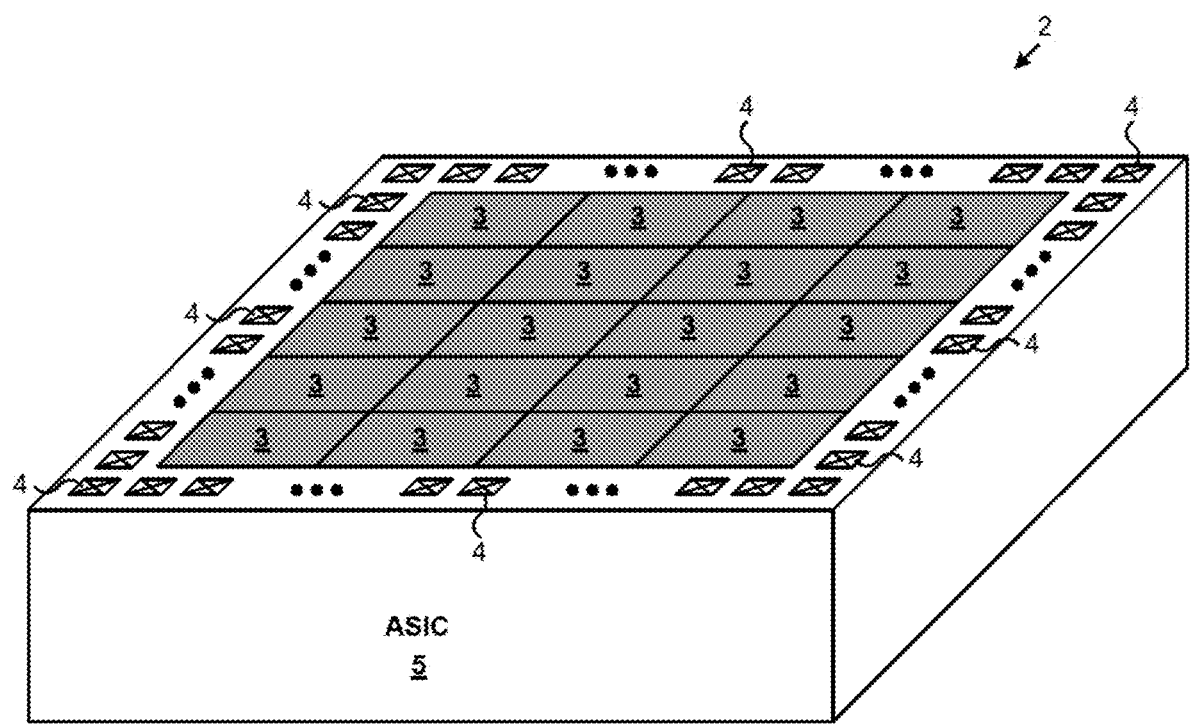
FIG. 2 illustrates a perspective view of a portion of a rapid testing ROIC according to one implementation of the present application.

FIG. 2 illustrates a perspective view of a portion of a rapid testing ROIC according to one implementation of the present application. ROIC 2 in FIG. 2 generally corresponds to any of ROICs 2 in FIG. 1. As shown in FIG. 2, ROIC 2 includes designs 3, contact pads 4, and application specific integrated circuit (ASIC) 5. Contact pads 4 and PCM RF switches in designs 3 reside on ASIC 5. As described below, circuitry for testing the PCM RF switches resides within ASIC 5. In particular, ASIC 5 includes circuitry for providing programming signals and test signals for testing PCM RF switches in designs 3. ASIC 5 also generates test data for reading out through contact pads 4.

Figure 3:
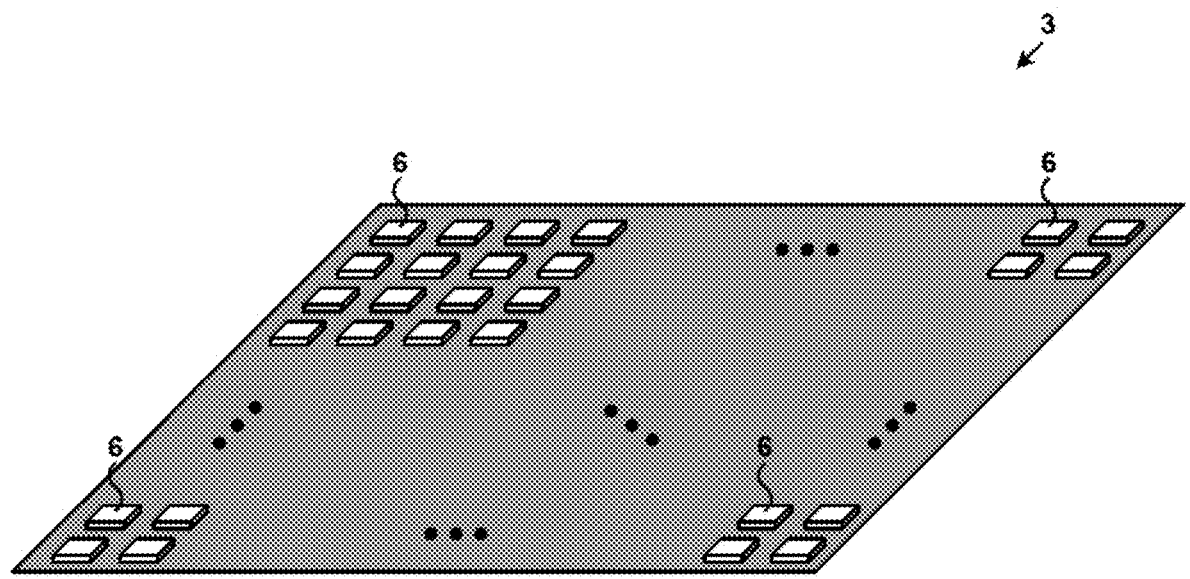
FIG. 3 illustrates a perspective view of a portion of an array of phase-change material (PCM) radio frequency (RF) switches according to one implementation of the present application.

FIG. 3 illustrates a perspective view of a portion of an array of phase-change material (PCM) radio frequency (RF) switches according to one implementation of the present application. Design 3 includes the array of PCM RF switches 6. Additional details regarding PCM RF switches 6 are described below. Design 3 in FIG. 3 generally corresponds to any of designs 3 in FIG. 2. Although design 3 is connected to test circuitry within an ASIC, such as ASIC 5 in FIG. 2, the connectors, test circuitry, and ASIC are not shown in FIG. 3.

In one implementation, design 3 includes one thousand (1,000) PCM RF switches 6. In this implementation, each of the twenty designs 3 in FIG. 2 can include one thousand PCM RF switches 6, and ROIC 2 in FIG. 2 can have a total of twenty thousand (20,000) PCM RF switches 6. Different designs 3 can include different PCM RF switches. However, in one implementation, all designs 3 contain identical PCM RF switches. Each of the fifty seven (57) ROICs 2 in wafer 1 in FIG. 1 can include twenty thousand (20,000) PCM RF switches 6, and wafer 1 in FIG. 1 can have a total of one million one hundred forty thousand (1,140,000) PCM RF switches 6. In various implementations, design 3 can include more of fewer PCM RF switches 6. In various implementations, PCM RF switches 6 can be arranged in manners other than an array.

Testing large numbers of PCM RF switches 6 using conventional means, for example, by connecting external probes of an ATE to one individual PCM RF switch at a time, would be impractical. In order to achieve statistically significant results regarding the reliability of a PCM RF switch, it might be necessary to test the PCM RF switch for more than one million test cycles. Due to time delays associated with switching between ON/OFF states and time delays associated with generating test data, it could take a day or longer to complete more than one million test cycles for a single PCM RF switch. Thus, testing all twenty thousand (20,000) PCM RF switches 6 on a single ROIC 2 would take an impractically long time. Also, as described below, PCM RF switches 6 can have four terminals. External probes and corresponding contact pads are generally significantly larger than PCM RF switches 6. As such, providing contact pads for each terminal of the twenty thousand (20,000) PCM RF switches 6 on ROIC 2 would also be impractical.

Figure 4:
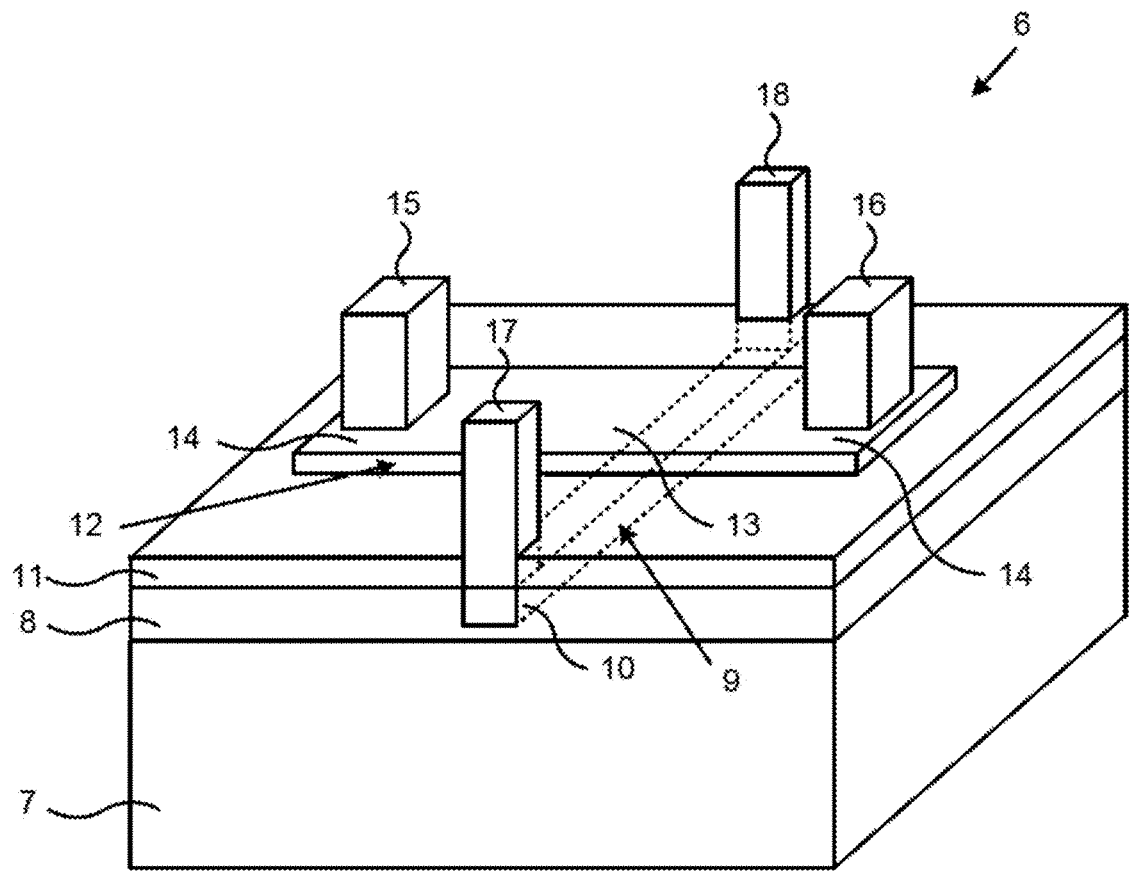
FIG. 4 illustrates a perspective view of a portion of PCM RF switch according to one implementation of the present application.

FIG. 4 illustrates a perspective view of a portion of PCM RF switch according to one implementation of the present application. PCM RF switch 6 in FIG. 4 generally corresponds to any of PCM RF switches 6 in FIG. 3. As shown in FIG. 4, PCM RF switch 6 includes substrate 7, lower dielectric 8, heating element 9 having terminal segments 10, thermally conductive and electrically insulating material 11, PCM 12 having active segment 13 and passive segments 14, PCM contacts 15 and 16, and heater contacts 17 and 18. For purposes of illustration, the perspective view in FIG. 4 shows selected structures of PCM RF switch 6. PCM RF switch 6 may include other structures not shown in FIG. 4.

Substrate 7 is situated under lower dielectric 8. In one implementation, substrate 7 is an insulator, such as silicon oxide ($SiO_2$). In various implementations, substrate 7 is a silicon (Si), silicon-on-insulator (SOI), sapphire, complementary metal-oxide-semiconductor (CMOS), bipolar CMOS (BiCMOS), or group III-V substrate. In various implementations, substrate 7 includes a heat spreader or substrate 7 itself performs as a heat spreader. Substrate 7 can have additional layers (not shown in FIG. 4). In one implementation, substrate 7 can comprise a plurality of interconnect metal levels and interlayer dielectric layers. Substrate 7 can also comprise a plurality of devices, such as integrated passive devices (not shown in FIG. 4).

Lower dielectric 8 in PCM RF switch 6 is situated above substrate 7 and below thermally conductive and electrically insulating material 11. As shown in FIG. 4, lower dielectric 8 is also adjacent to sides of heating element 9. Lower dielectric 8 extends along the width of PCM RF switch 6, and is also coplanar with the top of heating element 9. Because PCM RF switch 6 includes lower dielectric 8 on the sides of heating element 9, less heat transfers horizontally (i.e., from the sides) and more heat dissipates vertically, from heating element 9 toward active segment 13 of PCM 12. In various implementations, lower dielectric 8 can have a relative width and/or a relative thickness greater or less than shown in FIG. 4. Lower dielectric 8 can comprise any material with thermal conductivity less than that of thermally conductive and electrically insulating material 11.

Heating element 9 in PCM RF switch 6 is situated in lower dielectric 8. Heating element 9 also approximately defines active segment 13 of PCM 12. Heating element 9 generates a crystallizing heat pulse or an amorphizing heat pulse for transforming active segment 13 of PCM 12. Heating element 9 can comprise any material capable of Joule heating. Heating element 9 can be connected to electrodes of a pulser (not shown in FIG. 4) that generates voltage or current pulses. Preferably, heating element 9 comprises a material that exhibits minimal or substantially no electromigration, thermal stress migration, and/or agglomeration. In various implementations, heating element 9 can comprise tungsten (W), molybdenum (Mo), titanium (Ti), titanium tungsten (TiW), titanium nitride (TiN), tantalumn (Ta), tantalum nitride (TaN), nickel chromium (NiCr), or nickel chromium silicon (NiCrSi). For example, in one implementation, heating element 9 comprises tungsten lined with titanium and titanium nitride.

Thermally conductive and electrically insulating material 11 in PCM RF switch 6 is situated on top of heating element 9 and lower dielectric layer 8, and under PCM 12 and, in particular, under active segment 13 of PCM 12. Thermally conductive and electrically insulating material 11 ensures efficient heat transfer from heating element 9 toward active segment 13 of PCM 12, while electrically insulating heating element 9 from PCM contacts 15 and 16. PCM 12, and other neighboring structures.

Thermally conductive and electrically insulating material 11 can comprise any material with high thermal conductivity and high electrical resistivity. In various implementations, thermally conductive and electrically insulating material 11 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 11 can be a nugget that does not extend along the width of PCM RF switch 6. For example, thermally conductive and electrically insulating material 11 can be a nugget approximately aligned with heating element 9.

PCM 12 in PCM RF switch 6 is situated on top of thermally conductive and electrically insulating material 11. PCM RF switch 6 utilizes PCM 12 to transfer input RF signals in an ON state and to block input RF signals in an OFF state. PCM 12 includes active segment 13 and passive segments 14. Active segment 13 of PCM 12 is approximately defined by heating element 9. Passive segments 14 of PCM 12 extend outward and are transverse to heating element 9, and are situated approximately under PCM contacts 15 and 16. As used herein, "active segment" refers to a segment of PCM that transforms between crystalline and amorphous phases, for example, in response to a crystallizing or an amorphizing heat pulse generated by heating element 9, whereas "passive segment" refers to a segment of PCM that does not make such transformation and maintains a crystalline phase (i.e., maintains a conductive state).

With proper heat pulses and heat dissipation, active segment 13 of PCM 12 can transform between crystalline and amorphous phases, allowing PCM RF switch 6 to switch between ON and OFF states respectively. Active segment 13 of PCM 12 must be heated and rapidly quenched in order for PCM RF switch 6 to switch states. If active segment 13 of PCM 12 does not quench rapidly enough, it will not transform, and PCM RF switch 6 will fail to switch states. How rapidly active segment 13 of PCM 12 must be quenched depends on the material, volume, and temperature of PCM 12. In one implementation, the quench time window can be approximately one hundred nanoseconds (100 ns) or greater or less.

PCM 12 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 12 can be germanium telluride having from forty percent to sixty percent germanium by composition (i.e., $Ge_XTe_Y$, where $0.4 \leq X \leq 0.6$ and $Y=1-X$). The material for PCM 12 can be chosen based upon ON state resistivity, OFF state electric field breakdown voltage, crystallization temperature, melting temperature, or other considerations. It is noted that in FIG. 4, heating element 9 is transverse to PCM 12. Heating element 9 is illustrated with dashed lines as seen through various structures of PCM RF switch 6. Current flowing in heating element 9 flows approximately under active segment 13 of PCM 12.

PCM contacts 15 and 16 in PCM RF switch 6 are connected to passive segments 14 of PCM 12. Similarly, heater contacts 17 and 18 are connected to terminal segments 10 of heating element 9. PCM contacts 15 and 16 provide RF signals to and from PCM 12. Heater contacts 17 and 18 provide power to heating element 9 for generating a crystallizing heat pulse or an amorphizing heat pulse. In various implementations, PCM contacts 15 and 16 and heater contacts 17 and 18 can comprise tungsten (W), copper (Cu), or aluminum (Al). PCM contacts 15 and 16 and heater contacts 17 and 18 can extend through various dielectric layers (not shown in FIG. 4). In one implementation, in order to ensure uniform contact between PCM 12 and PCM contacts 15 and 16, PCM contacts 15 and 16 can extend through a contact uniformity support layer (not shown in FIG. 4) situated on top of PCM 12, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

Figure 5A:
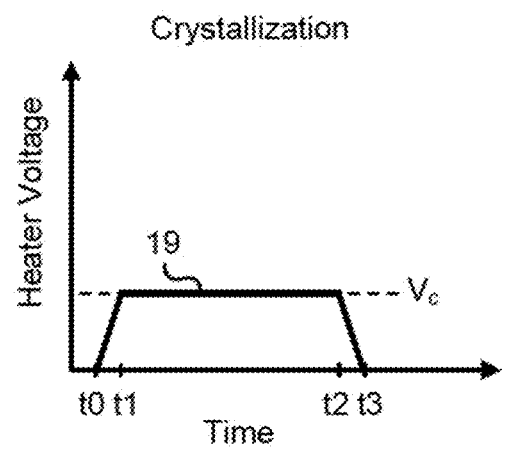
FIG. 5A illustrates an exemplary graph of heater voltage versus time according to one implementation of the present application.

FIG. 5A illustrates an exemplary graph of heater voltage versus time according to one implementation of the present application. The heater voltage-time graph in FIG. 5A includes trace 19 which represents the voltage at a heater contact of a heating element, such as heater contact 18 of heating element 9 in FIG. 4, plotted over time when a crystallizing electrical pulse is applied to the heating element. As shown in FIG. 5A, from time t0 to time t1, trace 19 rises from zero voltage to approximately crystallization voltage $V_C$. From time t1 to time t2, trace 19 remains approximately at crystallization voltage $V_C$. From time t2 to time t3, trace 19 falls from approximately crystallization voltage $V_C$ to zero voltage.

An electrical pulse that holds the heating element at or above crystallization voltage $V_C$ for a sufficient amount of time will cause the heating element to generate a crystallizing heat pulse that will transform a PCM into a crystalline phase. Accordingly, such an electrical pulse may be referred to as a crystallizing electrical pulse in the present application. Crystallization voltage $V_C$ and the amount of time needed to transform the PCM into a crystalline phase depends on various factors, such the material, dimensions, temperature, and thermal conductivity of the heating element, the PCM, and their neighboring structures. In one implementation, crystallization voltage $V_C$ can be approximately six volts (6 V). In one implementation, the time required can range from approximately one hundred nanoseconds to two thousand nanoseconds (100 ns-2,000 ns) or greater or less. In the present exemplary implementation, the duration from time t to time t2 in FIG. 5A can be approximately one thousand nanoseconds (1,000 ns), and thus, trace 19 represents a crystallizing electrical pulse. The durations from time t0 to time t1 and from time t2 to time t3 in FIG. 5A represent rise and fall times of a pulser, and can each be approximately ten nanoseconds (10 ns) or less.

Figure 5B:
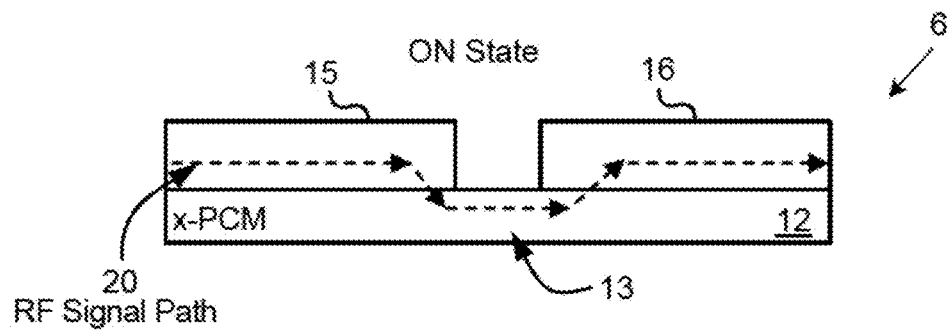
FIG. 5B illustrates a portion of an exemplary PCM RF switch in an ON state according to one implementation of the present application.

FIG. 5B illustrates a portion of an exemplary PCM RF switch in an ON state according to one implementation of the present application. The PCM RF switch in FIG. 5B generally corresponds to PCM RF switch 6 in FIG. 4, and may have any implementations or advantages described above. As illustrated in FIG. 5B, PCM RF switch 6 includes PCM 12 having active segment 13, PCM contacts 15 and 16, and RF signal path (or simply referred to as "RF signal") 20.

FIG. 5B illustrates PCM RF switch 6 after a crystallizing electrical pulse, such as the crystallizing electrical pulse in FIG. 5A, is applied to a heating element. As shown in FIG. 5B, PCM 12 is uniform and is denoted with the label "x-PCM," to indicate that PCM 12, including active segment 13 of PCM 12, is in the crystalline phase. PCM 12 in the crystalline phase has low resistivity and is able to easily conduct electrical current. Accordingly, RF signal 20 propagates along a path from PCM contact 15, through PCM 12, to PCM contact 16. It is noted that PCM contacts 15 and 16 can be substantially symmetrical and that their roles in PCM RF switch 6 can be reversed. PCM RF switch 6 in FIG. 5B is in an ON state.

Figure 6A:
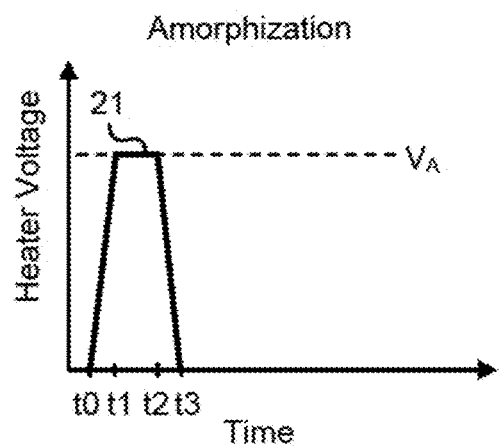
FIG. 6A illustrates an exemplary graph of heater voltage versus time according to one implementation of the present application.

FIG. 6A illustrates an exemplary graph of heater voltage versus time according to one implementation of the present application. The heater voltage-time graph in FIG. 6A includes trace 21 which represents the voltage at a heater contact of a heating element, such as heater contact 18 of heating element 9 in FIG. 4, plotted over time when an amorphizing electrical pulse is applied to the heating element. As shown in FIG. 6A, from time t0 to time t1, trace 21 rises from zero voltage to approximately amorphization voltage $V_A$. From time t1 to time t2, trace 21 remains approximately at amorphization voltage $V_A$. From time t2 to time t3, trace 21 falls from approximately amorphization voltage $V_A$ to zero voltage.

An electrical pulse that holds the heating element at or above amorphization voltage $V_A$ for a brief amount of time will cause the heating element to generate an amorphizing heat pulse that will transform a PCM into an amorphous phase. Accordingly, such an electrical pulse may be referred to as an amorphizing electrical pulse in the present application. Amorphization voltage $V_A$ and how briefly that voltage can be held to transform the PCM into an amorphous phase depends on various factors, such as the material, dimensions, temperature, and thermal conductivity of the heating element, the PCM, and their neighboring structures. In one implementation, amorphization voltage $V_A$ can be approximately fifteen volts (15 V). In one implementation, the time required can range from approximately fifty nanoseconds or less to approximately five hundred nanoseconds or less (50 ns-500 ns). In the present exemplary implementation, the duration from time t1 to time t2 in FIG. 6A can be approximately one hundred nanoseconds (100 ns), and thus, trace 21 represents an amorphizing electrical pulse. The durations from time t0 to time t1 and from time t2 to time t3 in FIG. 6A represent rise and fall times of a pulser, and can each be approximately ten nanoseconds (10 ns) or less.

Figure 6B:
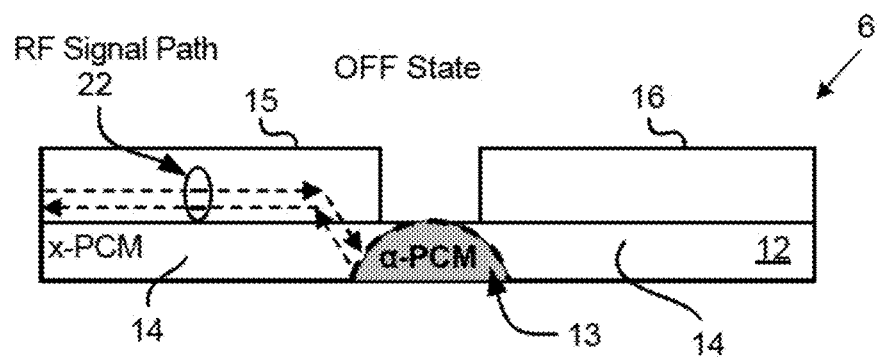
FIG. 6B illustrates a portion of an exemplary PCM RF switch in an OFF state according to one implementation of the present application.

FIG. 6B illustrates a portion of an exemplary PCM RF switch in an OFF state according to one implementation of the present application. The PCM RF switch in FIG. 6B generally corresponds to PCM RF switch 6 in FIG. 4, and may have any implementations or advantages described above. As illustrated in FIG. 6B, PCM RF switch 6 includes PCM 12 having active segment 13 and passive segments 14, PCM contacts 15 and 16, and RF signal path (or simply referred to as "RF signal") 22.

FIG. 6B illustrates PCM RF switch 6 after an amorphizing electrical pulse, such as the amorphizing electrical pulse in FIG. 6A, is applied to a heating element. As shown in FIG. 6B, PCM 12 is not uniform. Active segment 13 is denoted with the label "α-PCM," to indicate that active segment 13 is in the amorphous phase. Passive segments 14 are denoted with the label "x-PCM," to indicate that passive segments 14 are in the crystalline phase. As described above, "active segment" refers to a segment of PCM that transforms between crystalline and amorphous phases, whereas "passive segment" refers to a segment of PCM that does not make such transformation and maintains a crystalline phase (i.e., maintains a conductive state). Active segment 13 of PCM 12 in the amorphous phase has high resistivity and is not able to conduct electrical current well. Accordingly, RF signal 22 does not propagate along a path from PCM contact 15, through PCM 12, to PCM contact 16. It is noted that PCM contacts 15 and 16 can be substantially symmetrical and that their roles in PCM RF switch 6 can be reversed. PCM RF switch 6 in FIG. 6B is in an OFF state.

Figure 7:
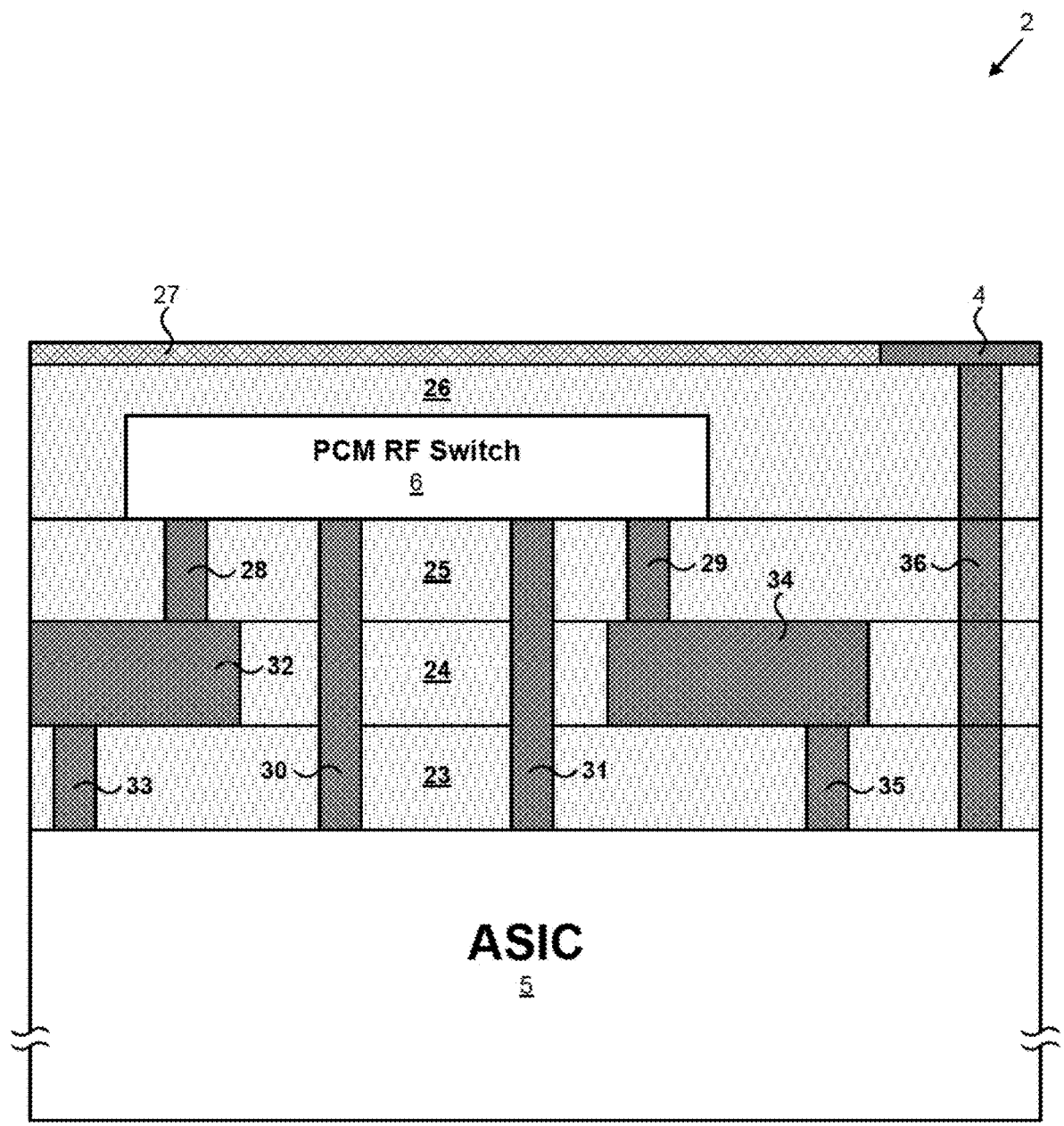
FIG. 7 illustrates a cross-sectional view of a portion of a rapid testing ROIC according to one implementation of the present application.

FIG. 7 illustrates a cross-sectional view of a portion of a rapid testing ROIC according to one implementation of the present application. ROIC 2 includes ASIC 5. PCM RF switch 6, pre-metal dielectric 23, first metallization level 24, first interlayer dielectric 25, second metallization level 26, passivation 27, vias 28, 29, 30, 31, 33, 35, and 36, interconnect metals 32 and 34, and contact pad 4. It is noted that in the present application, multiple vias, metal segments, and contacts connected as a unit may be referred to as a "via" for ease of reference. For example, in FIG. 7, via 36 includes a contact in pre-metal dielectric 23, a first metal segment in first metallization level 24, a first via in first interlayer dielectric 25, and a second metal segment in second metallization level 26. Metal segments are typically wider than vias and contacts and include overplots; however, for ease of illustration and for focus on the present inventive concepts, the metal segments and vias and contacts are shown as one continuous "via" 36 in ROIC 2.

PCM RF switch 6 in FIG. 7 generally corresponds to PCM RF switch 6 in FIG. 4, and may have any implementations and advantages described above. However, PCM RF switch 6 is shown with less detail in FIG. 7 to preserve conciseness. Pre-metal dielectric 23 is situated over ASIC 5. First metallization level 24, first interlayer dielectric 25, second metallization level 26, and passivation 27 are sequentially situated over pre-metal dielectric 23. In various implementations, pre-metal dielectric 23 can comprise borophosphosilicate glass (BPSG), tetra-ethyl ortho-silicate (TEOS), silicon onynitride ($Si_XO_YN_Z$), silicon oxide ($Si_XO_Y$), silicon nitride ($Si_XN_Y$), or another dielectric. In various implementations, first interlayer dielectric 25 and passivation 27 can comprise $Si_XO_Y$, $Si_XN_Y$, or another dielectric. For example, in one implementation, first interlayer dielectric 25 comprises chemical vapor deposition (CVD) $Si_XO_Y$, and passivation 27 comprises high density plasma CVD (HDP-CVD) $Si_XN_Y$. Moreover, first metallization level 24 and second metallization level 26 can comprise $Si_XO_Y$, $Si_XN_Y$, or another dielectric between metal segments in each metallization level. For example, in one implementation, first metallization level 24 and second metallization level 26 can include HDP-CVD $Si_XO_Y$ between metal segments in each metallization level. In various implementations, ROIC 2 can include more metallization levels and/or more interlayer dielectrics than those shown in FIG. 7.

PCM RF switch 6 is situated in second metallization level 26. Vias 28, 29, 30, and 31 are situated below PCM RF switch 6. Vias 28 and 29 electrically connect to PCM contacts 15 and 16 respectively (shown in FIG. 4) of PCM RF switch 6. Vias 30 and 31 electrically connect to heater contacts 17 and 18 respectively (shown in FIG. 4) of PCM RF switch 6. Via 33 is situated in pre-metal dielectric 23 between ASIC 5 and interconnect metal 32. Interconnect metal 32 is situated in first metallization level 24. Via 28 extends through first interlayer dielectric 25 between interconnect metal 32 and PCM RF switch 6. Via 28, interconnect metal 32, and via 33 electrically connect ASIC 5 to PCM contact 15 (shown in FIG. 4) of PCM RF switch 6. Via 35 is situated in pre-metal dielectric 23 between ASIC 5 and interconnect metal 34. Interconnect metal 34 is situated in first metallization level 24. Via 29 extends through first interlayer dielectric 25 between interconnect metal 34 and PCM RF switch 6. Via 29, interconnect metal 34, and via 35 electrically connect ASIC 5 to PCM contact 16 (shown in FIG. 4) of PCM RF switch 6. Via 30 and 31 electrically connect heater contacts 17 and 18 respectively (shown in FIG. 4) of PCM RF switch 6 to ASIC 5. Contact pad 4 is situated at the top of ROIC 2 and in a window in passivation 27. Via 36 electrically connects ASIC 5 to contact pad 4.

In various implementations, ROIC 2 can include more or fewer vias and/or interconnect metals than those shown in FIG. 7. Vias and interconnect metals can also electrically connect to other structures (not shown in FIG. 7), such as passive devices built in various metallization levels. Also, it is noted that the actual relative position of vias 28, 29, 30, and 31 may be different from the exemplary cross-sectional view shown in FIG. 7. For example, via 30 in FIG. 7 (connected to heater contact 17 in FIG. 4) may be situated on a different plane relative to vias 28 and 29 (connected to PCM contacts 15 and 16 in FIG. 4 respectively), and via 31 in FIG. 7 (connected to heater contact 18 in FIG. 4) may be situated on yet a different plane relative to vias 28 and 29. In other words, vias 28 and 29 may be situated in different planes and crosswise to vias 30 and 31.

As described below, ASIC 5 includes circuitry for testing PCM RF switch 6, such as circuitry for generating crystallizing and amorphizing electrical pulses and circuitry for generating test signals. Vias 28, 29, 30, 31, 33, 35, and 36 and interconnect metals 32 and 34 provide connections between this test circuitry and PCM RF switch 6. ASIC 5 is also electrically connected to contact pad 4. Contact pad 4 in FIG. 7 generally corresponds to any of contact pads 4 in FIG. 2. As described above, contact pad 4 provides a contact point for external probes (not shown in FIG. 7) used for reading out test data generated by ROIC 2 and for other functions, such as providing power and/or ground to ROIC 2, and providing bi-directional communications between ROIC 2 and an ATE.

Figure 8A:
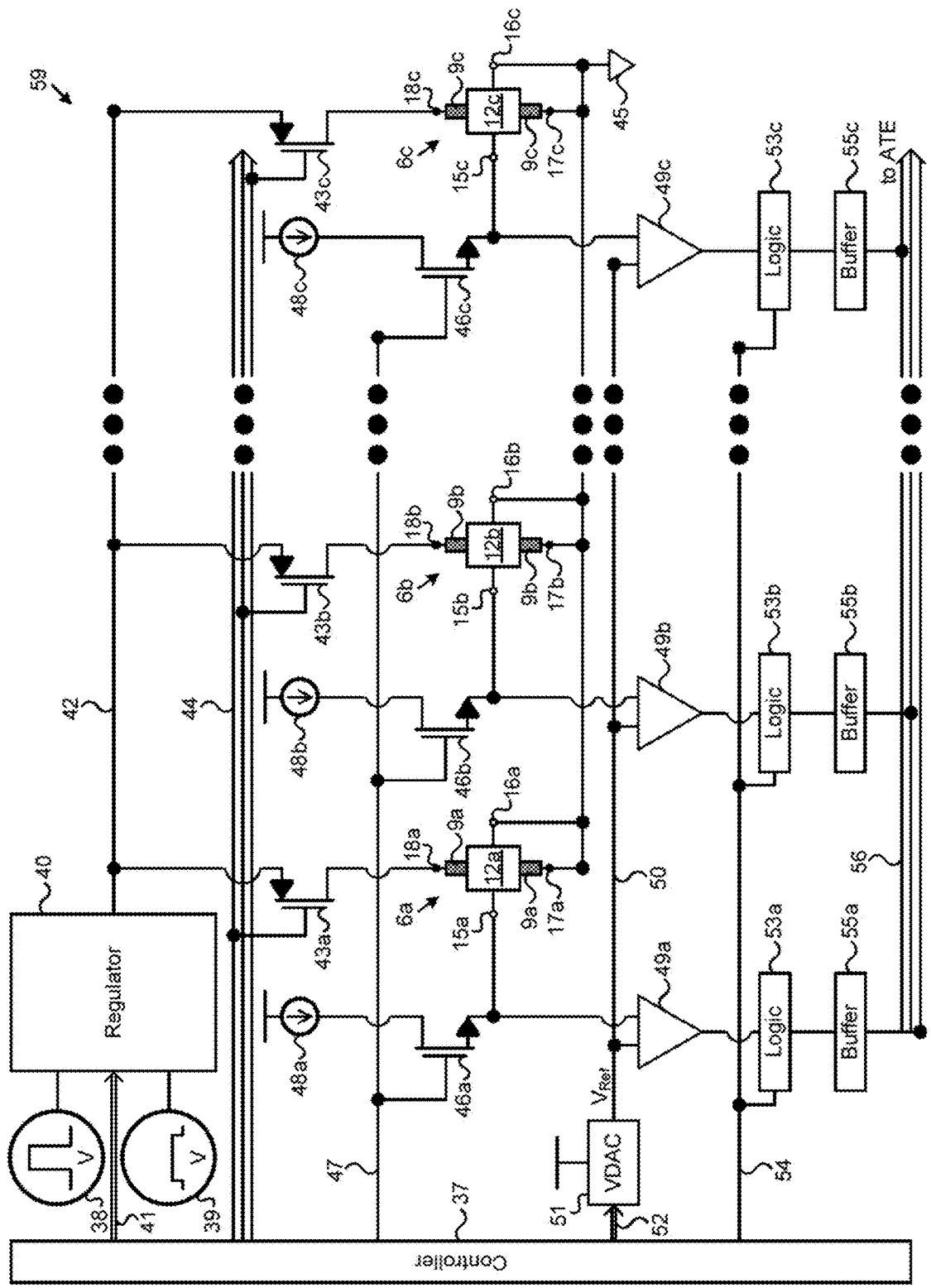
FIG. 8A illustrates a circuit in a portion of a rapid testing ROIC according to one implementation of the present application.

FIG. 8A illustrates a circuit in a portion of a rapid testing ROIC according to one implementation of the present application. As shown in FIG. 8A, circuit 59 includes PCM RF switches 6a, 6b, and 6c, controller 37, pulsers 38 and 39, regulator 40, regulator control bus 41, pulser line 42, voltage pulse enable transistors 43a, 43b, and 43c, voltage pulse enable control bus 44, ground 45, test current enable transistors 46a, 46b, and 46c, test current enable control line 47, current sources 48a, 48b, and 48c, comparators 49a, 49b, and 49c, reference voltage ($V_{Ref}$) 50, voltage digital-to-analog converter (VDAC) 51, VDAC control bus 52, logics 53a, 53b, 53c, logic control line 54, buffers 55a, 55b, and 55c, and read out bus 56. Circuit 59 in FIG. 8A generally illustrates test circuitry that supports any one of designs 3 in FIG. 2. Components other than PCM RF switches 6a, 6b, and 6c and connections thereto are situated in an ASIC, such as ASIC 5 in FIG. 2. PCM RF switches 6a, 6b, and 6c in FIG. 8A generally correspond to PCM RF switch 6 in FIG. 4 and may have any implementations and advantages described above.

Controller 37 provides general control over testing functions of circuit 59, as well as clocking and synchronization. In particular, controller 37 selects which of PCM RF switches 6a, 6b, and 6c will receive a crystallizing or an amorphizing electrical pulse, which type (a crystallizing or an amorphizing) the electrical pulse will be, and when to determine an ON/OFF state of PCM RF switches 6a, 6b, and 6c.

Pulsers 38 and 39 generate electrical pulses. Pulser 38 periodically generates amorphizing electrical pulses, such as the amorphizing electrical pulse shown by trace 21 in FIG. 6A. Pulser 39 periodically generates crystallizing electrical pulses, such as the crystallizing electrical pulse shown by trace 19 in FIG. 5A. Pulsers 38 and 39 can have digitally programmable amplitudes, pulse widths, and periods. In one implementation, the pulse widths and periods of pulsers 38 and 39 are chosen such that the delay between the falling edge of a pulse and the rising edge of a subsequent pulse is approximately one microsecond (1 µs). In one implementation, pulsers 38 and 39 have rise times and fall times of approximately ten nanoseconds (10 ns) or less. In the present implementation, pulsers 38 and 39 are illustrated as voltage pulsers. However, as used in the present application, a "pulser" encompasses and includes a voltage pulser, a current pulser, or any other type of pulser, and a "voltage pulser" and a "voltage pulse" also encompass and include a "current pulser" and a "current pulse."

Regulator 40 is coupled to pulsers 38 and 39, controller 37, and pulser line 42. Based on input received from controller 37 along regulator control bus 41, regulator 40 allows electrical pulses from only one of pulsers 38 and 39 at a time, and blocks electrical pulses from the other. When circuit 59 is providing amorphizing electrical pulses to PCM RF switches 6a, 6b, and 6c, regulator 40 allows pulses from pulser 38 and blocks pulses from pulser 39. Conversely, when circuit 59 is providing crystallizing electrical pulses to PCM RF switches 6a, 6b, and 6c, regulator 40 blocks pulses from pulser 38 and allows pulses from pulser 39. The allowed electrical pulses are output along pulser line 42. In one implementation, regulator 40 comprises multiple pass transistors whose gates are coupled to regulator control bus 41.

Voltage pulse enable transistors 43a, 43b, and 43c selectively provide crystallizing and amorphizing electrical pulses to PCM RF switches 6a, 6b, and 6c respectively. As used in the present application, the term "voltage pulse enable transistor" refers to a transistor capable of selectively providing an electrical pulse, regardless of whether the electrical pulse is a voltage pulse, a current pulse, or any other type of electrical pulse; and thus the term encompasses a "current pulse enable transistor" as well. In the present implementation, voltage pulse enable transistors 43a, 43b, and 43c are shown as p-type fields effect transistors (PFETs). In other implementations, voltage pulse enable transistors 43a, 43b, and 43c can be any other type of transistor. The drains of voltage pulse enable transistors 43a, 43b, and 43c are coupled to pulser line 42. The sources of voltage pulse enable transistors 43a, 43b, and 43c are coupled to respective heater contacts 18a, 18b, and 18c of respective heating elements 9a, 9b, and 9c of respective PCM RF switches 6a, 6b, and 6c. Heater contacts 17a, 17b, and 17c are coupled to ground 45. The gates of voltage pulse enable transistors 43a, 43b, and 43c are coupled to voltage pulse enable control bus 44.

Based on input received from controller 37 along voltage pulse enable control bus 44, one of voltage pulse enable transistors 43a, 43b, and 43c can be selectively turned on, thereby providing crystallizing or amorphizing electrical pulses to a corresponding selected one of PCM RF switches 6a, 6b, and 6c. For example, controller 37 can turn on voltage pulse enable transistor 43a to select PCM RF switch 6a. If pulser line 42 is passing amorphizing electrical pulses from pulser 38, voltage pulse enable transistor 43a will provide an amorphizing electrical pulse to PCM RF switch 6a at heater contact 18a. Assuming PCM RF switch 6a functions properly, heating element 9a will generate a heat pulse that transforms an active segment of PCM 12a into an amorphous phase, and PCM RF switch 6a will switch to an OFF state. PCM RF switch will maintain in an OFF state until voltage pulse enable transistor 43a provides it with a crystallizing electrical pulse.

Subsequently, controller 37 can then turn off voltage pulse enable transistor 43a and turn on voltage pulse enable transistor 43b to select PCM RF switch 6b. Similarly, controller 37 can then turn off voltage pulse enable transistor 43b and turn on voltage pulse enable transistor 43c to select PCM RF switch 6c. In one implementation, controller 37 can synchronize voltage pulse enable control bus 44 with the periods of electrical pulses at pulser line 42 such that each of voltage pulse enable transistors 43a, 43b, and 43c is only turned on for the duration of one electrical pulse (i.e., such that a single one of PCM RF switches 6a, 6b, or 6c is not provided with the same electrical pulse twice in a row). In one implementation, a dummy load can be coupled to pulser line 42 to keep current flowing when no voltage pulse enable transistors 43a, 43b, or 43c are turned on.

In practice, circuit 59 can include many more than the three PCM RF switches 6a, 6b, and 6c shown in FIG. 8A. For example, circuit 59 can have a total of one thousand (1,000) PCM RF switches. In one implementation, rather than using a single voltage pulse enable control bus 44 and one voltage pulse enable transistors per PCM RF switch, circuit 59 can include PCM RF switches arranged in array, with one pulse enable transistor per row and one pulse enable transistor per column, along with a row enable control bus and a column enable control bus. In various implementations, circuit 59 can concurrently provide crystallizing and/or amorphizing pulses to multiple PCM RF switches at time, for example, by using multiple sets of pulsers 38 and 39, or by using higher amplitude pulsers 38 and 39. In various implementations, heater contacts 17a, 17b, and 17c are not directly coupled to ground 45, and are coupled to intermediate components.

In addition to the circuitry described above for providing crystallizing and amorphizing electrical pulse to switch PCM RF switches 6a, 6b, and 6c between ON and OFF states, circuit 59 in FIG. 8A includes circuitry for testing whether PCM RF switches 6a, 6b, and 6c function properly and successfully switch states. As described above, this test circuitry is situated in an ASIC, such as ASIC 5 in FIG. 2.

Test current enable transistors 46a, 46b, and 46c provide test currents to PCM RF switches 6a, 6b, and 6c respectively. As used in the present application, the term "test current enable transistor" refers to a transistor capable of selectively providing test power, regardless of whether the test power is a test current, a test voltage, or any other type of test power; thus the term also encompasses a "test voltage enable transistor." In the present implementation, test current enable transistors 46a, 46b, and 46c are shown as n-type fields effect transistors (NFETs). In other implementations, test current enable transistors 46a, 46b, and 46c can be any other type of transistor. The drains of test current enable transistors 46a, 46b, and 46c are coupled to respective current sources 48a, 48b, and 48c. As used in the present application, the term "current source" refers to a power source, regardless of whether the power source is a current source, a voltage source, or any other type of power source; thus the term also encompasses a "voltage source." The sources of test current enable transistors 46a, 46b, and 46c are coupled to respective PCM contacts 15a, 15b, and 15c of respective PCMs 12a, 12b, and 12c of respective PCM RF switches 6a, 6b, and 6c. PCM contacts 16a, 16b, and 16c are coupled to ground 45. The gates of test current enable transistors 46a, 46b, and 46c are coupled to test current enable control line 47.

Based on input received from controller 37 along test current enable control line 47, test current enable transistors 46a, 46b, and 46c can be concurrently turned on, thereby providing test currents to respective PCM RF switches 6a, 6b, and 6c. For example, controller 37 can turn on test current enable transistors 46a, 46b, and 46c. Test current enable transistors 46a, 46b, and 46c will provide test currents from respective current sources 48a, 48b, and 48c to respective PCM RF switches 6a, 6b, and 6c at respective PCM contacts 15a, 15b, and 15c. Assuming PCM RF switches 6a, 6b, and 6c were recently provided with crystallizing electrical pulse and function properly, the test currents will propagate along paths from PCM contacts 15a, 15b, and 15c, through PCMs 12a, 12b, and 12c to PCM contacts 16a, 16b, and 16c. Because PCM RF switches 6a, 6b, and 6c are in ON states (i.e., low-resistance states) and because PCM contacts 16a, 16b, and 16c are grounded, the voltages at PCM contacts 15a, 15b, and 15c will be low or approximately equal to ground. Conversely, assuming PCM RF switches 6a, 6b, and 6c were recently provided with amorphizing electrical pulses and function properly, the voltages at PCM contacts 15a, 15b, and 15c will be high, because PCM RF switches 6a, 6b, and 6c are in OFF states (i.e., high-resistance states).

In various implementations, current sources 48a, 48b, and 48c can provide different test currents in response to crystallizing electrical pulses than in response to amorphizing electrical pulses. For example, after voltage pulse enable transistors 43a, 43b, or 43c provide crystallizing electrical pulses to PCM RF switches 6a, 6b, and 6c, current sources 48a, 48b, and 48c can provide ten milliampere (10 mA) test currents to PCM RF switches 6a, 6b, and 6c; meanwhile, after voltage pulse enable transistors 43a, 43b, or 43c provide amorphizing electrical pulses to PCM RF switches 6a, 6b, and 6c, current sources 48a, 48b, and 48c can provide ten microampere (10 μA) test currents to PCM RF switches 6a, 6b, and 6c. In the present implementation, test current enable control line 47 provides test currents to all PCM RF switches 6a, 6b, and 6c concurrently. In another implementation, test current enable control line 47 may be a bus for providing test currents only to selected PCM RF switches at a given time.

Comparators 49a, 49b, and 49c have first inputs coupled to respective PCM contacts 15a, 15b, and 15c second inputs coupled to $V_{Ref}$ 50. Comparators 49a, 49b, and 49c compare the voltages at respective PCM contacts 15a, 15b, and 15c against the voltage at $V_{Ref}$ 50, and output respective digital signals indicating which is larger. These signals can determine if the respective PCM RF switches 6a, 6b, and 6c are in OFF states or in ON states. $V_{Ref}$ 50 can be chosen based on the test currents provided by current sources 48a, 48b, and 48c and/or the resistances across PCM RF switches 6a, 6b, and 6c. VDAC 51 can be an 8-bit VDAC for programming $V_{Ref}$ 50 to a range of voltages based on input received from controller 37 along VDAC control bus 52. It is noted that the power supplies for VDAC 51, current sources 48a, 48b, and 48c, pulsers 38 and 39, and controller 37 may be provided by an external source to, for example, through any of contact pads 4 in FIG. 2, or by a micro-battery or other energy conversion means in the ROIC itself.

In one implementation, VDAC 51 can program different voltages for $V_{Ref}$ 50 in response to crystallizing electrical pulses than in response to amorphizing electrical pulses. For example, after voltage pulse enable transistors 43a, 43b, or 43c provide crystallizing electrical pulses to PCM RF switches 6a, 6b, and 6c, VDAC 51 can program an ON state reference voltage ($V_{RefON}$) of two tenths of a volt (0.2 V) for $V_{Ref}$ 50; meanwhile, after voltage pulse enable transistors 43a, 43b, or 43c provide amorphizing electrical pulses to PCM RF switches 6a, 6b, and 6c. VDAC 51 can program an OFF state reference voltage ($V_{RefOFF}$) of three volts (3 V) for $V_{Ref}$ 50.

Logics 53a, 53b, and 53c are coupled to the outputs of respective comparators 49a, 49b, and 49c and to controller 37. Based on input received from comparators 49a, 49b, and 49c and from controller 37 along logic control line 54, logics 53a, 53b, and 53c can detect errors. For example, after voltage pulse enable transistors 43a, 43b, or 43c provide crystallizing electrical pulses to PCM RF switches 6a, 6b, and 6c, if comparators 49a, 49b, and/or 49c indicate that the voltages at respective PCM contacts 15a, 15b, and/or 15c are less than $V_{RefON}$ (e.g., less than 0.2 V), circuit 59 will determine that corresponding PCM RF switches 6a, 6b, and/or 6c are in ON states and will not detect an error; if comparators 49a, 49b, and/or 49c indicate that the voltages at respective PCM contacts 15a, 15b, and/or 15c are greater than $V_{RefON}$ (e.g., greater than 0.2 V), circuit 59 will determine that corresponding PCM RF switches 6a, 6b, and/or 6c are not in ON states and will detect an error.

Conversely, after voltage pulse enable transistors 43a, 43b, or 43c provide amorphizing electrical pulses to PCM RF switches 6a, 6b, and 6c, if comparators 49a. 49b, and/or 49c indicate that the voltages at respective PCM contacts 15a, 15b, and/or 15c are less than $V_{RefOFF}$ (e.g., less than 3 V), circuit 59 will determine that corresponding PCM RF switches 6a, 6b, and/or 6c are not in OFF states and will detect an error; if comparators 49a, 49b, and/or 49c indicate that the voltages at respective PCM contacts 15a, 15b, and/or 15c are greater than $V_{RefOFF}$ (e.g., greater than 3 V), circuit 59 will determine that corresponding PCM RF switches 6a, 6b, and/or 6c are in OFF states and will not detect an error. In this example, logic control line 54 is a binary value indicating whether comparisons are being made after all PCM RF switches 6a, 6b, and 6c were provided crystallizing electrical pulses or all PCM RF switches 6a, 6b, and 6c were provided amorphizing electrical pulses. In other implementations, logic control line 54 may be a bus indicating, for each of PCM RF switches 6a, 6b, and 6c, whether a comparison is being made after a crystallizing electrical pulse or after an amorphizing electrical pulse.

Buffers 55a, 55b, and 55c are coupled to respective logics 53a, 53b, and 53c. Buffers 55a, 55b, and 55c are configured to store detected errors in circuit 59. In one implementation, buffers 55a, 55b, and 55c are each 4-bit counters. Using read out bus 56, buffers 55a, 55b, and 55c are also configured to provide errors to external probes coupled to an ATE (not shown in FIG. 8A). In one implementation, read out bus 56 is a serial peripheral interface (SPI) implemented using contact pads 4 in FIG. 2. In one implementation, buffers 55a, 55b, and 55c may read out errors after each test current is provided. In another implementation, buffers 55a, 55b, and 55c may read out errors after a fixed number of cycles. In yet another implementation, buffers 55a, 55b, and 55c may read out errors whenever one buffer reaches a storage limit, after which buffers 55a, 55b, and 55c can be reset. Errors read out from buffers 55a, 55b, and 55c can also be combined with addressing information and information provided by controller 37 to distinguish which PCM RF switches experienced an error, which cycles the errors occurred after, and whether the error was encountered in response to a crystallizing or an amorphizing electrical pulse (e.g., error occurred on PCM RF switch number 968 on cycle number 262,395 after the amorphizing pulse).

Figure 8B:
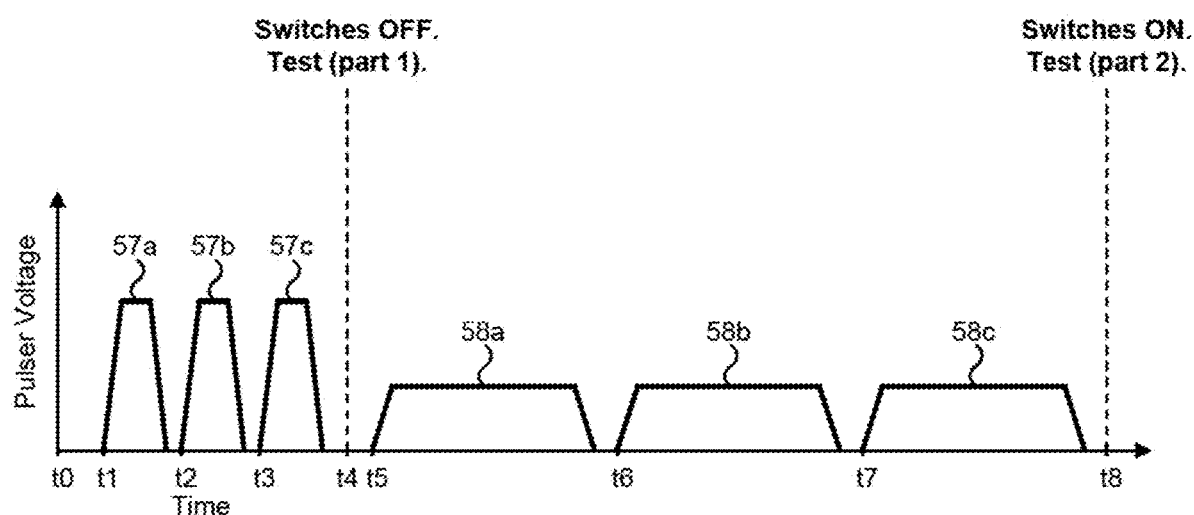
FIG. 8B illustrates an exemplary graph of pulser voltage versus time according to one implementation of the present application.

FIG. 8B illustrates an exemplary graph of pulser voltage versus time according to one implementation of the present application. The pulser voltage-time graph in FIG. 8B represents the voltage at a pulser line, such as pulser line 42 in FIG. 8A, plotted over time. Accordingly, the graph in FIG. 8A is described below with reference to circuit 59 in FIG. 8A. From time t0 to time t4 in FIG. 8B, regulator 40 in FIG. 8A is passing pulser 38. As shown in FIG. 8B, amorphizing electrical pulses 57a, 57b, and 57c begin at respective times t1, t2, and t3. During amorphizing electrical pulse 57a in FIG. 8B, voltage pulse enable transistor 43a in FIG. 8A is turned on. Voltage pulse enable transistor 43a in FIG. 8A can be turned on prior to time t1 in order to account for a turn-on time delay of voltage pulse enable transistor 43a. Voltage pulse enable transistor 43a in FIG. 8A can also be turned off prior to time t2 in order to account for a turn-off time delay of voltage pulse enable transistor 43a. Similarly, during amorphizing electrical pulses 57b and 57c in FIG. 8B, voltage pulse enable transistors 43b and 43c in FIG. 8A are turned on respectively.

Amorphizing electrical pulses 57a, 57b, and 57c generally correspond to the amorphizing electrical pulse shown in FIG. 6A, and may have any implementations or advantages described above. For example, each of amorphizing electrical pulses 57a, 57b, and 57c can have a rise time of approximately ten nanoseconds (10 ns), a pulse width of approximately one hundred nanoseconds (100 ns), and a fall time of approximately ten nanoseconds (10 ns). In one implementation, the delay between the falling edge of amorphizing electrical pulse 57a and the rising edge of subsequent amorphizing electrical pulse 57b, as well as the delay between the falling edge of amorphizing electrical pulse 57b and the rising edge of subsequent amorphizing electrical pulse 57c, are each approximately one microsecond (1 μs).

At time t4 in FIG. 8B, all PCM RF switches 6a, 6b, and 6c in FIG. 8A are presumed to be in OFF states, and test current enable transistors 46a, 46b, and 46c are concurrently turned on to provide test currents from current sources 48a, 48b, and 48c to respective PCM RF switches 6a, 6b, and 6c. Comparators 49a, 49b, and 49c compare the voltages at respective PCM contacts 15a, 15b, and 15c against $V_{RefOFF}$, and determine if respective PCM RF switches 6a, 6b, and 6c are in OFF states or not. For any of PCM RF switches 6a, 6b, and 6c not in an OFF state, the corresponding logics 53a, 53b, and 53c detect an error. In one implementation, the time it takes for comparators 49a, 49b, and 49c to determine OFF states and for logics 53a, 53b, and 53c to detect errors is approximately ten nanoseconds (10 ns). In one implementation, time t4 occurs ten microseconds (10 μs) after the end of amorphizing electrical pulse 57c, such that PCM 12c of PCM RF switch 6c has time to cool and stabilize before test current enable transistor 46c provides a test current to PCM 12c of PCM RF switch 6c.

As described above, in practice, circuit 59 in FIG. 8A will have many more than the three PCM RF switches 6a, 6b, and 6c. Accordingly, the graph in FIG. 8A may have more than three amorphizing electrical pulses 57a, 57b, and 57c between time t0 and the provision of test currents at time t4. Where circuit 59 includes one thousand (1,000) PCM RF switches, the total time between t0 and t4 can be approximately one thousand one hundred and thirty microseconds (1.130 μs).

From time t4 to time t8 in FIG. 8B, regulator 40 in FIG. 8A is blocking pulser 38 and passing pulser 39. As shown in FIG. 8B, crystallizing electrical pulses 58a, 58b, and 58c begin at respective times t5, t6, and t7. During crystallizing electrical pulse 58a in FIG. 8B, voltage pulse enable transistor 43a in FIG. 8A is turned on. Voltage pulse enable transistor 43a in FIG. 8A can be turned on prior to time t5 in order to account for a turn-on time delay of voltage pulse enable transistor 43a. Voltage pulse enable transistor 43a in FIG. 8A can also be turned off prior to time t6 in order to account for a turn-off time delay of voltage pulse enable transistor 43a. Similarly, during crystallizing electrical pulses 58b and 58c in FIG. 8B, voltage pulse enable transistors 43b and 43c in FIG. 8A are turned on respectively.

Crystallizing electrical pulses 58a, 58b, and 58c generally correspond to the crystallizing electrical pulse shown in FIG. 5A, and may have any implementations or advantages described above. For example, each of crystallizing electrical pulses 58a, 58b, and 58c can have a rise time of approximately ten nanoseconds (10 ns), a pulse width of approximately one thousand nanoseconds (1,000 ns), and a fall time of approximately ten nanoseconds (10 ns). In one implementation, the delay between the falling edge of crystallizing electrical pulse 58a and the rising edge of subsequent crystallizing electrical pulse 58b, as well as the delay between the falling edge of crystallizing electrical pulse 58b and the rising edge of subsequent crystallizing electrical pulse 58c, are each approximately one microsecond (1 μs).

At time t8 in FIG. 8B, all PCM RF switches 6a, 6b, and 6c in FIG. 8A are presumed to be in ON states, and test current enable transistors 46a, 46b, and 46c are concurrently turned on to provide test currents from current sources 48a, 48b, and 48c to respective PCM RF switches 6a, 6b, and 6c. Comparators 49a, 49b, and 49c compare the voltages at respective PCM contacts 15a, 15b, and 15c against $V_{RefON}$, and determine if respective PCM RF switches 6a, 6b, and 6c are in ON states or not. For any of PCM RF switches 6a, 6b, and 6c not in an ON state, the corresponding logics 53a, 53b, and 53c detect an error. In one implementation, the time it takes for comparators 49a, 49b, and 49c to determine ON states and for logics 53a, 53b, and 53c to detect errors is approximately ten nanoseconds (10 ns). In one implementation, time t8 occurs ten microseconds (10 μs) after then end of crystallizing electrical pulse 58c, such that PCM 12c of PCM RF switch 6c has time to cool and stabilize before test current enable transistor 46c provides a test current to PCM 12c of PCM RF switch 6c.

As described above, in practice, circuit 59 in FIG. 8A will have many more than the three PCM RF switches 6a, 6b, and 6c. Accordingly, the graph in FIG. 8A may have more than three crystallizing electrical pulses 58a, 58b, and 58c between time t4 and the provision of test currents at time t8. Where circuit 59 includes one thousand (1,000) PCM RF switches, the total time between t4 and t8 can be approximately two thousand and thirty microseconds (2,030 μs).

Continuing the above examples, the total cycle time between t0 and t8 (i.e., the time to switch one thousand (1,000) PCM RF switches in a single design 3 OFF and ON, detecting errors after both OFF and ON states) can be approximately three thousand one hundred and sixty microseconds (3,160 μs). Thus, the total time to complete one million (1,000,000) cycles for a single design 3 can be approximately 3,160 seconds, i.e., approximately fifty three minutes (53 min). Since each design 3 is supported by its own circuit 59, all twenty designs 3 (shown in FIG. 2) can be cycled in parallel, and errors for all twenty designs 3 can be detected in parallel. However, because there are significantly more PCM RF switches 6 than contact pads 4, errors and other test information are not necessarily read out from each circuit 59 in parallel. In one implementation, the time to read out errors and other test information for a single design 3 to external test probes of an ATE is approximately thirty seconds (30 s). The total time to read out errors and other test information for twenty designs 3 to external test probes of an ATE is approximately 600 seconds (i.e. 20 times 30 seconds), or ten minutes. Thus, the total time to complete one million cycles and read out for a ROIC, such as ROIC 2 in FIG. 2, is approximately sixty three minutes (63 min). Assuming all twenty thousand (20,000) PCM RF switches 6 in ROIC 2 have the same structure, this amounts to testing the same PCM RF switch structure through twenty billion (20,000,000,000) cycles in approximately sixty three minutes (63 min).

Figure 8C:
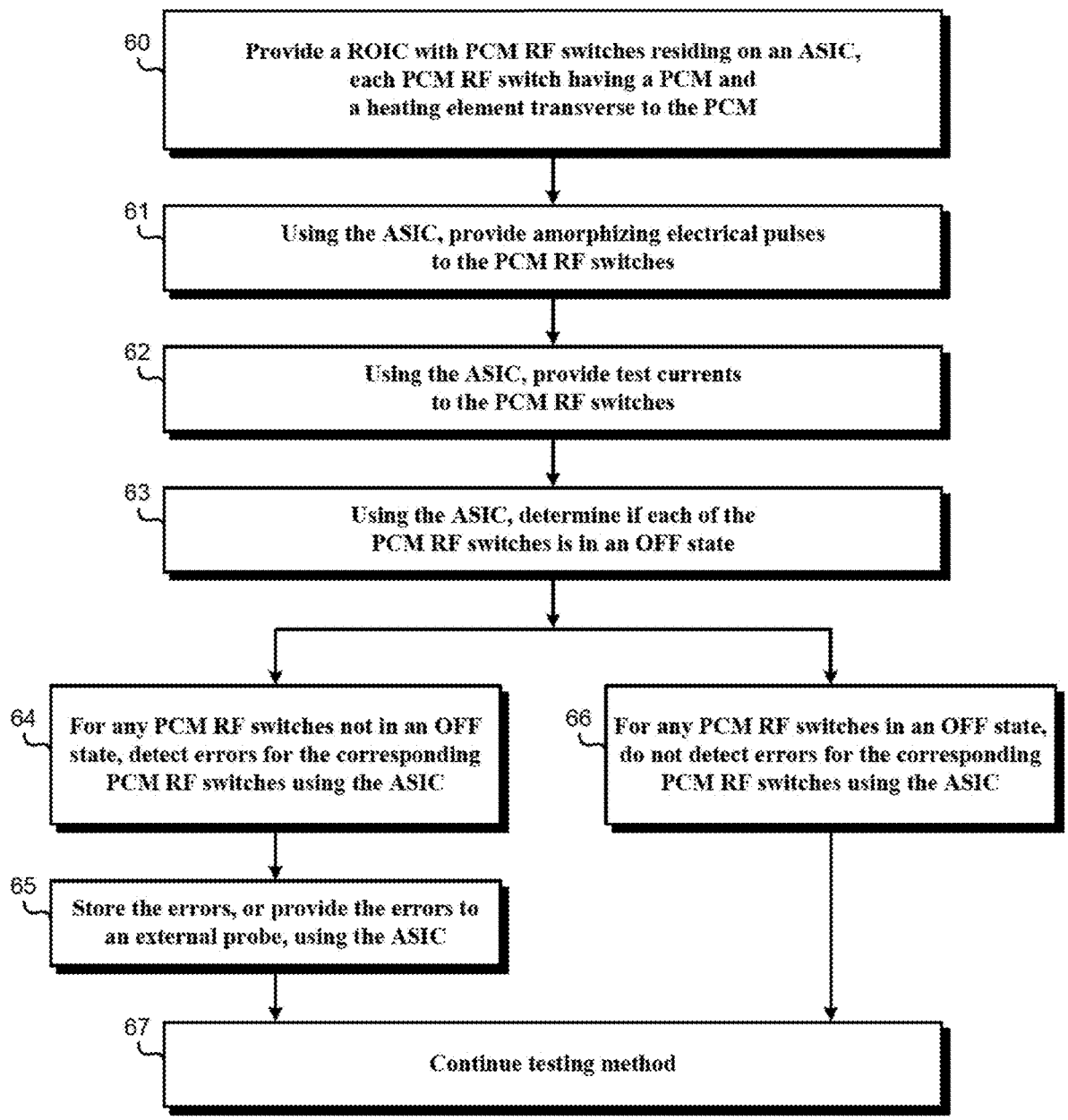
FIG. 8C illustrates a portion of a flowchart of an exemplary method for rapidly testing PCM RF switches according to one implementation of the present application.

FIG. 8C illustrates a portion of a flowchart of an exemplary method for rapidly testing PCM RF switches according to one implementation of the present application. Actions 60 through 67 shown in the flowchart of FIG. 8C are sufficient to describe one implementation of the present inventive concepts. Other implementations of the present inventive concepts may utilize actions different from those shown in the flowchart of FIG. 8C. Certain details and features have been left out of the flowchart that are apparent to a person of ordinary skill in the art. For example, an action may consist of one or more sub-actions or may involve specialized equipment or materials, as known in the art. Moreover, some actions are omitted so as not to distract from the illustrated actions.

The flowchart begins with action 60 by providing a ROIC with PCM RF switches residing on an ASIC, each PCM RF switch having a PCM and a heating element transverse to the PCM. The ROIC and ASIC can correspond to ROIC 2 and ASIC 5 in FIG. 2. The PCM RF switches can correspond to PCM RF switches 6a, 6b, and 6c in FIG. 8A.

The flowchart continues with action 61 by using the ASIC to provide amorphizing electrical pulses to the PCM RF switches. The amorphizing electrical pulses can correspond to amorphizing electrical pulses 57a, 57b, and 57c in FIG. 8B. The amorphizing electrical pulses 57a, 57b, and 57c can be generated by a pulser located in ASIC 5, such as pulser 38 in FIG. 8A. The amorphizing electrical pulses 57a, 57b, and 57c are provided to heater contacts of PCM RF switches 6a, 6b, and 6c, such as heater contacts 18a, 18b, and 18c in FIG. 8A. The amorphizing electrical pulses 57a, 57b, and 57c can be selectively provided to PCM RF switches 6a, 6b, and 6c through voltage pulse enable transistors 43a, 43b, and 43c located in ASIC 5.

The flowchart continues at action 62 with using the ASIC to provide test currents to the PCM RF switches. The test currents can be generated by current sources located in ASIC 5, such as current sources 48a, 48b, and 48c in FIG. 8A. The test currents are provided to PCM contacts of PCM RF switches 6a, 6b, and 6c, such as PCM contacts 15a, 15b, and 15c in FIG. 8A. The test currents can be concurrently provided to PCM RF switches 6a, 6b, and 6c through test current enable transistors 46a, 46b, and 46c located in ASIC 5.

The flowchart continues at action 63 with using the ASIC to determine if each of the PCM RF switches is in an OFF state. Comparators located in ASIC 5, such as comparators 49a, 49b, and 49c, can be used to determine if PCM RF switches are in OFF states by comparing voltages at PCM contacts 15a, 15b, and 15c against a reference voltage, such as $V_{Ref}$ 50. In one implementation. VDAC 51 can program an OFF state reference voltage ($V_{RefOFF}$) of three volts (3 V) for $V_{Ref}$ 50. If comparators 49a, 49b, and/or 49c indicate that the voltages at respective PCM contacts 15a, 15b, and/or 15c are less than $V_{RefOFF}$ (e.g., less than 3 V). ASIC 5 will determine that corresponding PCM RF switches 6a, 6b, and/or 6c are not in OFF states and the flowchart will continue to action 64.

At action 64, for any PCM RF switches not in an OFF state, the flowchart continues by detecting errors for the corresponding PCM RF switches using the ASIC. Errors can be detected using logics 53a, 53b, and 53c located in ASIC 5. The flowchart continues at action 65 with storing the errors, or providing the errors to an external probe, using the ASIC. Errors can be stored using buffers 55a, 55b, and 55c located in ASIC 5. Errors can be provided to an external probe by reading out from buffers 55a, 55b, and 55c using read out bus 56 located in ASIC 5. The external probe may be coupled to an ATE for receiving and analyzing test data generated by ROIC 2. In one implementation, ASIC 5 may read out errors after each test current is provided. In another implementation, ASIC 5 may read out errors after a fixed number of cycles. In yet another implementation. ASIC 5 may read out errors whenever one buffer reaches a storage limit, after which buffers 55a, 55b, and 55c can be reset.

Returning to action 63, if comparators 49a, 49b, and/or 49c indicate that the voltages at respective PCM contacts 15a, 15b, and/or 15c are greater than $V_{RefOFF}$ (e.g., greater than 3 V), ASIC 5 will determine that corresponding PCM RF switches 6a, 6b, and/or 6c are in OFF states and the flowchart will proceed to action 66. At action 66, for any PCM RF switches in an OFF state, the flowchart continues by not detecting errors for the corresponding PCM RF switches using the ASIC. From actions 65 and 66, the flowchart concludes at action 67 with continuing the testing method. Action 67 can encompass various actions such as providing crystallizing electrical pulses to the PCM RF switches, determining if the PCM RF switches are in OFF states using another voltage for $V_{RefOFF}$, analyzing test data generated by the ROIC using the ATE, etc.

Figure 8D:
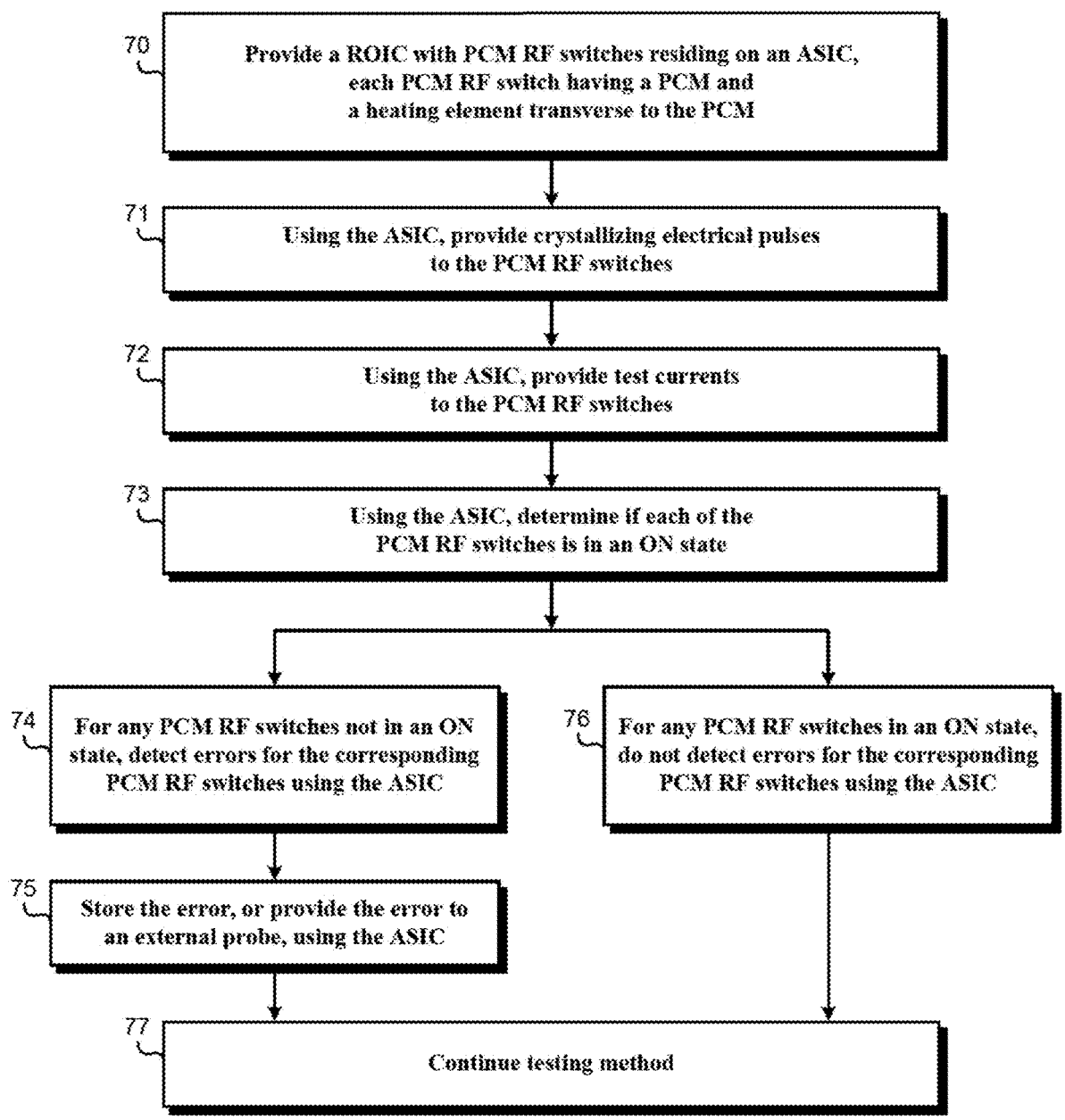
FIG. 8D illustrates a portion of a flowchart of an exemplary method for rapidly testing PCM RF switches according to one implementation of the present application.

FIG. 8D illustrates a portion of a flowchart of an exemplary method for rapidly testing PCM RF switches according to one implementation of the present application. Actions 70 through 77 shown in the flowchart of FIG. 8D are sufficient to describe one implementation of the present inventive concepts. Other implementations of the present inventive concepts may utilize actions different from those shown in the flowchart of FIG. 8D. Certain details and features have been left out of the flowchart that are apparent to a person of ordinary skill in the art. For example, an action may consist of one or more sub-actions or may involve specialized equipment or materials, as known in the art. Moreover, some actions are omitted so as not to distract from the illustrated actions.

The flowchart begins with action 70 by providing a ROIC with PCM RF switches residing on an ASIC, each PCM RF switch having a PCM and a heating element transverse to the PCM. The ROIC and ASIC can correspond to ROIC 2 and ASIC 5 in FIG. 2. The PCM RF switches can correspond to PCM RF switches 6a, 6b, and 6c in FIG. 8A.

The flowchart continues with action 71 by using the ASIC to provide crystallizing electrical pulses to the PCM RF switches. The crystallizing electrical pulses can correspond to crystallizing electrical pulses 58a, 58b and 58c in FIG. 8B. The crystallizing electrical pulses 58a, 58b, and 58c can be generated by a pulser located in ASIC 5, such as pulser 38 in FIG. 8A. The crystallizing electrical pulses 58a, 58b, and 58c are provided to heater contacts of PCM RF switches 6a, 6b, and 6c, such as heater contacts 18a, 18b, and 18c in FIG. 8A. The crystallizing electrical pulses 58a, 58b, and 58c can be selectively provided to PCM RF switches 6a, 6b, and 6c through voltage pulse enable transistors 43a, 43b, and 43c located in ASIC 5.

The flowchart continues at action 72 with using the ASIC to provide test currents to the PCM RF switches. The test currents can be generated by current sources located in ASIC 5, such as current sources 48a, 48b, and 48c in FIG. 8A. The test currents are provided to PCM contacts of PCM RF switches 6a, 6b, and 6c, such as PCM contacts 15a, 15b, and 15c in FIG. 8A. The test currents can be concurrently provided to PCM RF switches 6a, 6b, and 6c through test current enable transistors 46a, 46b, and 46c located in ASIC 5. Current sources 48a, 48b, and 48c can provide different test currents in action 72 in FIG. 8D than in action 62 in FIG. 8C. For example, current sources 48a, 48b, and 48c can provide ten milliampere (10 mA) test currents to PCM RF switches 6a, 6b, and 6c in action 72 in FIG. 8D. Meanwhile, current sources 48a, 48b, and 48c can provide ten microampere (10 µA) test currents to PCM RF switches 6a, 6b, and 6c in action 62 in FIG. 8C.

The flowchart continues at action 73 with using the ASIC to determine if each of the PCM RF switches is in an ON state. Comparators located in ASIC 5, such as comparators 49a, 49b, and 49c, can be used to determine if PCM RF switches are in ON states by comparing voltages at PCM contacts 15a, 15b, and 15c against a reference voltage, such as $V_{Ref}$ 50. In one implementation. VDAC 51 can program an ON state reference voltage ($V_{RefON}$) of two tenths of a volt (0.2 V) for $V_{Ref}$ 50. If comparators 49a, 49b, and/or 49c indicate that the voltages at respective PCM contacts 15a, 15b, and/or 15c are greater than $V_{RefON}$ (e.g., greater than 0.2 V), ASIC 5 will determine that corresponding PCM RF switches 6a, 6b, and/or 6c are not in ON states and the flowchart will continue to action 74.

At action 74, for any PCM RF switches not in an ON state, the flowchart continues by detecting errors for the corresponding PCM RF switches using the ASIC. Errors can be detected using logics 53a, 53b, and 53c located in ASIC 5. The flowchart continues at action 75 with storing the errors, or providing the errors to an external probe, using the ASIC. Errors can be stored using buffers 55a, 55b, and 55c located in ASIC 5. Errors can be provided to an external probe by reading out from buffers 55a, 55b, and 55c using read out bus 56 located in ASIC 5. The external probe may be coupled to an ATE for receiving and analyzing test data generated by ROIC 2. In one implementation. ASIC 5 may read out errors after each test current is provided. In another implementation, ASIC 5 may read out errors after a fixed number of cycles. In yet another implementation, ASIC 5 may read out errors whenever one buffer reaches a storage limit, after which buffers 55a, 55b, and 55c can be reset.

Returning to action 73, if comparators 49a, 49b, and/or 49c indicate that the voltages at respective PCM contacts 15a, 15b, and/or 15c are less than $V_{RefON}$ (e.g., less than 0.2 V), ASIC 5 will determine that corresponding PCM RF switches 6a, 6b, and/or 6c are in ON states and the flowchart will proceed to action 76. At action 76, for any PCM RF switches in an ON state, the flowchart continues by not detecting errors for the corresponding PCM RF switches using the ASIC. From actions 75 and 76, the flowchart concludes at action 77 with continuing the testing method. Action 77 can encompass various actions such as providing amorphizing electrical pulses to the PCM RF switches, determining if the PCM RF switches are in ON states using another voltage for $V_{RefON}$, analyzing test data generated by the ROIC using the ATE, etc.

Rapid testing ROICs according to the present invention are able to provide several advantages. First, because PCM RF switches 6 (shown in FIG. 3) reside on ASIC 5 (shown in FIG. 2), PCM RF switches 6 are integrated on the same chip as circuitry for programming and testing the PCM RF switches 6. Contact pads 4 (shown in FIG. 2) do not have to be used for receiving electrical pulses and test currents from external probes, and more contact pads 4 can be dedicated to reading out errors and other test data generated by ROIC 4. Multiple contact pads 4 are also not required for each PCM RF switch 6, avoiding complexities in layout and fabrication. The proximity of PCM RF switches and ASIC 5 also allows for connections with reduced contact resistances. Reduced contact resistances reduce power loss and increase the accuracy of error detection, particularly because long cables are not used to provide test currents, and their impedances do not need to be accounted for when choosing $V_{Ref}$ 50.

Second, because ROIC 2 includes voltage pulse enable transistors 43a, 43b, and 43c (shown in FIG. 8A) that provide amorphizing and crystallizing electrical pulses from pulser line 42 to selected PCM RF switches 6a, 6b, and 6c, ROIC 2 reduces testing time delays associated with PCM temperature and phase stabilization. Controller 37 can synchronize voltage pulse enable control bus 44 with the periods of electrical pulses at pulser line 42 such that each of voltage pulse enable transistors 43a, 43b, and 43c is only turned on for the duration of one electrical pulse. For example, voltage pulse enable transistor 43a can provide an electrical pulse to PCM RF switch 6a, then voltage pulse enable transistor 43b can immediately provide another electrical pulse to PCM RF switch 6b and the beginning of the next pulse period, and then voltage pulse enable transistor 43c can immediately provide another electrical pulse to PCM RF switch 6c and the beginning of the next pulse period. It is not necessary to wait for the PCM of a PCM RF switch to cool and stabilize before providing the next electrical pulse. In one implementation, this avoids delays of approximately ten microseconds (10 µs) or more between each subsequent electrical pulse.

Third, because ROIC 2 includes two pulsers 38 and 39 and regulator 40 (shown in FIG. 8A), ROIC 2 can reliably provide amorphizing and crystallizing electrical pulses to PCM RF switches 6a, 6b, and 6c. Using a single programmable pulser generally cannot provide an amplitude range and a pulse width range to generate both amorphizing and crystallizing electrical pulses without significant performance tradeoffs, such as loss of accuracy, longer rise/fall times, and longer minimum periods. In ROIC 2, pulser 38 can be dedicated to generating amorphizing electrical pulses having higher amplitude and narrower pulse width, while pulser 39 can be dedicated to generating crystallizing electrical pulses having lower amplitude and wider pulse width.

Fourth, ROIC 2 reduces time delays associated with generating test data. Because each of PCM RF switches 6a, 6b, and 6c (shown in FIG. 8A) includes corresponding currents sources 48a, 48b, and 48c, corresponding test current enable transistors 46a, 46b, and 46c, corresponding comparators 49a, 49b, and 49c, and corresponding logics 53a, 53b, and 53c, ROIC 2 supports simultaneous testing of numerous PCM RF switches. Test results do not have to be generated after each electrical pulse (as would be the case in a conventional approach). Rather, numerous electrical pulses can be provided, and then ROIC 2 can determine ON/OFF states and detect any errors for all PCM RF switches concurrently. In one implementation, this avoids delays of approximately twenty nanoseconds (20 ns) or more for each PCM RF switch in ROIC 2 beyond the first.

Fifth and finally, ROIC 2 enables generation of a statistically significant set of non-simulated test data at rapid speeds. In one implementation, the total time required for ROIC 2 to cycle twenty thousand (20,000) PCM RF switches 6 one million (1,000,000) cycles each and read out the corresponding errors can be approximately sixty three minutes (63 min). Assuming all twenty thousand (20,000) PCM RF switches 6 in ROIC 2 have the same or similar structure, this amounts to testing the same PCM RF switch structure through twenty billion (20,000,000,000) cycles in approximately sixty three minutes (63 min). As described above, testing through these many cycles using conventional means, for example, by connecting external probes of an ATE to an individual PCM RF switch at a time, could take more than fifty years. Thus, ROIC 2 enables rapid testing that is several orders of magnitude faster than conventional means.

Thus, various implementations of the present application achieve a rapid testing ROIC, and utilize the inventive ASIC of the present application, to overcome the deficiencies in the art to significantly reduce test delays, increase test accuracy, and generate large sets of test data. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A testing method comprising:
   providing phase-change material (PCM) radio frequency (RF) switches residing on an application specific integrated circuit (ASIC);
   providing, through said ASIC, amorphizing or crystallizing electrical pulses selectively to each of said PCM RF switches;
   substantially concurrently determining, by said ASIC, if each of said PCM RF switches is in an OFF state or in an ON state;
   detecting an error, by said ASIC, in said OFF state or said ON state of a first PCM RF switch in said PCM RF switches.

2. The testing method of claim 1, wherein said ASIC is configured to detect said error when said first PCM RF switch is not in said OFF state in response to said amorphizing electrical pulses or when said first PCM RF switch is not in said ON state in response to said crystallizing electrical pulses.

3. The testing method of claim 1, further comprising storing said error in said ASIC.

4. The testing method of claim 1, further comprising providing, by said ASIC, said error to an external probe.

5. The testing method of claim 4, wherein said external probe is coupled to an automatic test equipment (ATE).

6. The testing method of claim 1, wherein said ASIC comprises voltage pulse enable transistors configured to provide said amorphizing or crystallizing electrical pulses selectively to each of said PCM RF switches.

7. The testing method of claim 1, wherein a voltage at a PCM contact of said first PCM RF switch is compared against an OFF state reference voltage ($V_{RefOFF}$) to determine whether said first PCM RF switch is in said OFF state in response to said amorphizing electrical pulses.

8. The testing method of claim 1, wherein a voltage at a PCM contact of said first PCM RF switch is compared against an ON state reference voltage ($V_{RefON}$) to determine whether said first PCM RF switch is in said ON state in response to said crystallizing electrical pulses.

9. A testing method comprising:
   providing an application specific integrated circuit (ASIC) coupled to phase-change material (PCM) radio frequency (RF) switches;
   providing amorphizing or crystallizing electrical pulses selectively to each of said PCM RF switches;
   substantially concurrently determining, by said ASIC, if each of said PCM RF switches is in an OFF state or in an ON state;
   detecting an error in said OFF state or said ON state of a first PCM RF switch in said PCM RF switches.

10. The testing method of claim 9, further comprising storing said error in said ASIC.

11. The testing method of claim 9, wherein said ASIC comprises voltage pulse enable transistors configured to provide said amorphizing or crystallizing electrical pulses selectively to each of said PCM RF switches.

12. The testing method of claim 9, wherein said detecting said error comprises determining if said first PCM RF switch is in said OFF state or in said ON state by comparing a voltage at a PCM contact of said first PCM RF switch against a reference voltage.

13. The testing method of claim 12, wherein said voltage at said PCM contact of said first PCM RF switch is compared against an OFF state reference voltage ($V_{RefOFF}$) to determine whether said first PCM RF switch is in said OFF state in response to said amorphizing electrical pulses.

14. The testing method of claim 12, wherein said voltage at said PCM contact of said first PCM RF switch is compared against an ON state reference voltage ($V_{RefON}$) to determine whether said first PCM RF switch is in said ON state in response to said crystallizing electrical pulses.

15. A testing method comprising:
   providing an application specific integrated circuit (ASIC);
   electrically connecting said ASIC to phase-change material (PCM) radio frequency (RF) switches;
   providing amorphizing or crystallizing electrical pulses selectively to each of said PCM RF switches;
   substantially concurrently determining if each of said PCM RF switches is in an OFF state or in an ON state;
   detecting an error in said OFF state or said ON state of a first PCM RF switch in said PCM RF switches.

16. The testing method of claim 15, further comprising storing said error in said ASIC.

17. The testing method of claim 15, further comprising providing, by said ASIC, said error to an automatic test equipment (ATE).

18. The testing method of claim 15, wherein said ASIC comprises voltage pulse enable transistors configured to provide said amorphizing or crystallizing electrical pulses selectively to each of said PCM RF switches.

19. The testing method of claim 15, wherein a voltage at a PCM contact of said first PCM RF switch is compared against an OFF state reference voltage ($V_{RefOFF}$) to determine whether said first PCM RF switch is in said OFF state in response to said amorphizing electrical pulses.

20. The testing method of claim 15, wherein a voltage at a PCM contact of said first PCM RF switch is compared against an ON state reference voltage ($V_{RefON}$) to determine whether said first PCM RF switch is in said ON state in response to said crystallizing electrical pulses.

* * * * *